(12) United States Patent
Masuoka et al.

(10) Patent No.: US 10,410,932 B2
(45) Date of Patent: *Sep. 10, 2019

(54) METHOD FOR PRODUCING PILLAR-SHAPED SEMICONDUCTOR DEVICE

(71) Applicant: Unisantis Electronics Singapore Pte. Ltd., Singapore (JP)

(72) Inventors: Fujio Masuoka, Tokyo (JP); Nozomu Harada, Tokyo (JP)

(73) Assignee: UNISANTIS ELECTRONICS SINGAPORE PTE. LTD., Singapore (SG)

(*) Notice: Subject to any disclaimer, the term of this patent is extended or adjusted under 35 U.S.C. 154(b) by 0 days.

This patent is subject to a terminal disclaimer.

(21) Appl. No.: 16/261,080

(22) Filed: Jan. 29, 2019

(65) Prior Publication Data

US 2019/0157166 A1  May 23, 2019

Related U.S. Application Data

(63) Continuation-in-part of application No. 15/712,637, filed on Sep. 22, 2017, now Pat. No. 10,229,916.

(Continued)

(30) Foreign Application Priority Data

Oct. 9, 2015  (WO) .................. PCT/JP2015/078776

(51) Int. Cl.
*H01L 21/336* (2006.01)
*H01L 21/8238* (2006.01)
(Continued)

(52) U.S. Cl.
CPC .............. *H01L 21/823871* (2013.01); *H01L 21/76805* (2013.01); *H01L 21/76889* (2013.01);
(Continued)

(58) Field of Classification Search
CPC ....... H01L 21/823871; H01L 29/78618; H01L 21/76889; H01L 21/76805;
(Continued)

(56) References Cited

U.S. PATENT DOCUMENTS 6,462,395 B1  10/2002  Fukuda et al.
10,229,916 B2* 3/2019  Masuoka ............ H01L 27/1104
(Continued)

FOREIGN PATENT DOCUMENTS

JP  H02-188966 A  7/1990
JP  H03-024753 A  2/1991
(Continued)

OTHER PUBLICATIONS

Morimoto, T. et al., "Self-Aligned Nickel-Mono-Silicide Technology for High-Speed Deep Submicrometer Logic CMOS ULSI" *IEEE Transaction on Electron Devices*, vol. 42, No. 5, 1995, pp. 915-922.

(Continued)

*Primary Examiner* — Vu A Vu
(74) *Attorney, Agent, or Firm* — Brinks Gilson & Lione

(57) ABSTRACT

A method for producing a pillar-shaped semiconductor device includes forming, above a NiSi layer serving as a lower wiring conductor layer and connecting to an $N^+$ layer of an SGT formed within a Si pillar, a first conductor W layer that extends through a NiSi layer serving as an upper wiring conductor layer and connecting to a gate TiN layer and that extends through a NiSi layer serving as an intermediate wiring conductor layer and connecting to an $N^+$ layer; forming an insulating $SiO_2$ layer between the NiSi layer and the W layer; and forming a second conductor W layer so as to surround the W layer and have its bottom at the upper surface layer of the NiSi layer, to achieve connection between the NiSi layer and the NiSi layer.

7 Claims, 25 Drawing Sheets

Related U.S. Application Data which is a continuation of application No. PCT/JP2016/066151, filed on Jun. 1, 2016.

(51) Int. Cl.

| | | |
|---|---|---|
| *H01L 27/11* | (2006.01) | |
| *H01L 27/092* | (2006.01) | |
| *H01L 29/423* | (2006.01) | |
| *H01L 29/786* | (2006.01) | |
| *H01L 21/768* | (2006.01) | |
| *H01L 23/535* | (2006.01) | |

(52) U.S. Cl.
CPC .......... *H01L 21/76895* (2013.01); *H01L 21/823885* (2013.01); *H01L 23/535* (2013.01); *H01L 27/092* (2013.01); *H01L 27/1108* (2013.01); *H01L 29/42392* (2013.01); *H01L 29/78618* (2013.01); *H01L 29/78642* (2013.01); *H01L 29/78651* (2013.01)

(58) Field of Classification Search
CPC .......... H01L 21/823885; H01L 23/535; H01L 21/76895; H01L 29/78651; H01L 29/42392; H01L 27/092; H01L 27/1108; H01L 29/78642
USPC .................................................. 438/269
See application file for complete search history.

(56) References Cited

U.S. PATENT DOCUMENTS

| | | |
|---|---|---|
| 2003/0136978 A1 | 7/2003 | Takaura et al. |
| 2004/0262635 A1 | 12/2004 | Lee |
| 2010/0219483 A1 | 9/2010 | Masuoka et al. |
| 2011/0303973 A1 | 12/2011 | Masuoka et al. |
| 2014/0061808 A1 | 3/2014 | Nakatsuka et al. |

FOREIGN PATENT DOCUMENTS

| | | |
|---|---|---|
| JP | 2003-224211 A | 8/2003 |
| JP | 2007-525004 A | 8/2007 |
| JP | 2010-040538 A | 2/2010 |
| JP | 2012-209340 A | 10/2012 |
| JP | 2014-53424 A | 3/2014 |
| JP | 5692884 B | 4/2015 |
| WO | WO2014/184933 A1 | 11/2014 |

OTHER PUBLICATIONS

Shibata, T. et al., "A New Field Isolation Technology for High Density MOS LSI", *Japanese Journal of Applied Physics*, vol. 18, 1979, pp. 263-267.

Takato, H. et al., "Impact of Surrounding Gate Transistor (SGT) for Ultra-High-Density LSI's", *IEEE Transaction on Electron Devices*, vol. 38, No. 3, 1991, pp. 573-578.

Gandhi, R. et al. "Vertical Si-Nanowire n-Type Tunneling FETs With Low Subthreshold Swing(<50mV/decade) at Room Temperature", *IEEE Electron Device Letter*, vol. 32, No. 4, 2011 pp. 437-439.

International Search Report, and English language translation thereof, in corresponding International Application No. PCT/JP2015/060763, dated May 26, 2015, 8 pages.

International Search Report, and English language translation thereof, in corresponding International Application No. PCT/JP2015/069689, dated Aug. 4, 2015, 4 pages.

International Search Report, and English language translation thereof, in corresponding International Application No. PCT/JP2015/078776, dated Nov. 10, 2015, 10 pages.

International Search Report, and English language translation thereof, in corresponding International Application No. PCT/JP2016/066151, dated Aug. 2, 2016, 7 pages.

International Preliminary Report on Patentability in corresponding International Application No. PCT/JP2015/078776, dated Oct. 12, 2017, 6 pages.

International Preliminary Report on Patentability in corresponding International Application No. PCT/JP2015/060763, dated Oct. 19, 2017, 5 pages.

English language translation of International Preliminary Examination Report in International Application No. PCT/JP2015/069689, dated Jan. 11, 2018, 6 pages.

The International Bureau of WIPO, International Preliminary Report on Patentability for Application No. PCT/JP2016/066151 dated Apr. 19, 2018, pp. 1-7.

\* cited by examiner

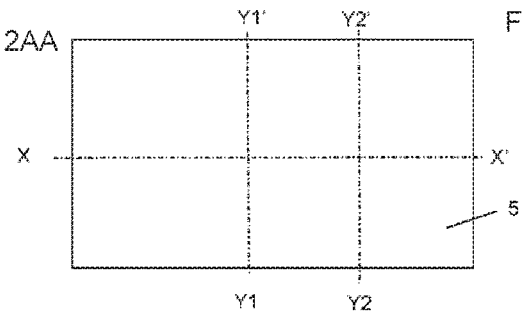
FIG. 2AA
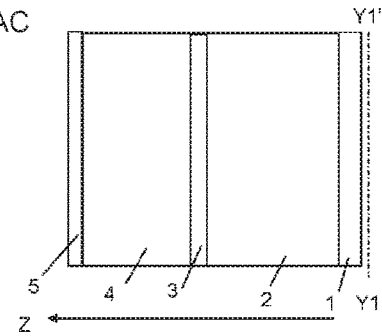
FIG. 2AC
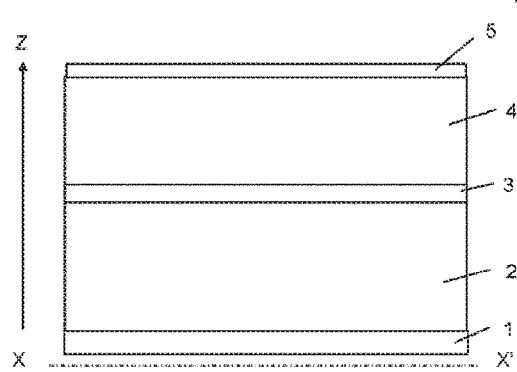
FIG. 2AB
FIG. 2AD
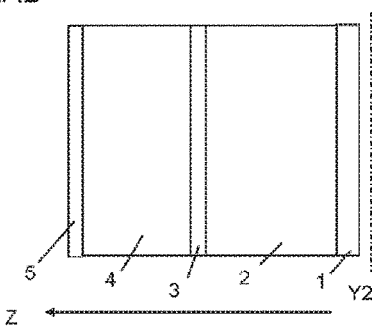
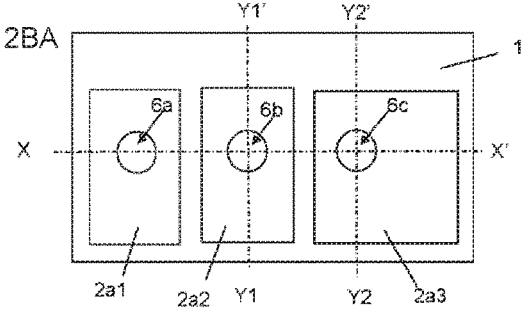
FIG. 2BA
FIG. 2BC
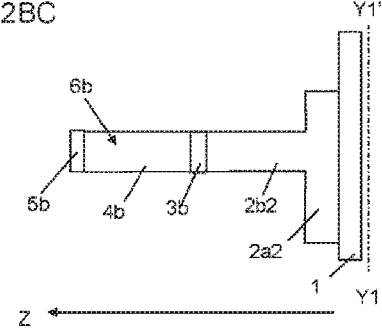
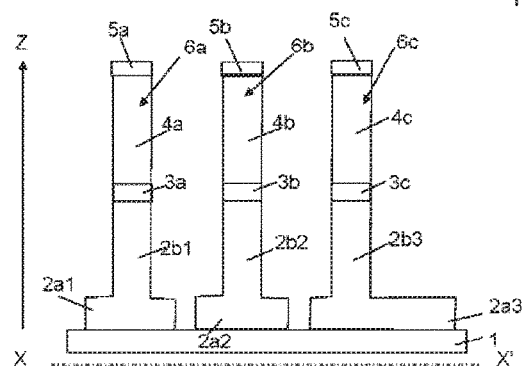
FIG. 2BB
FIG. 2BD
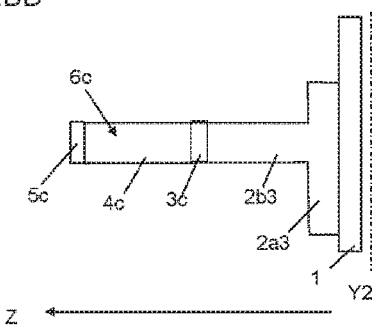

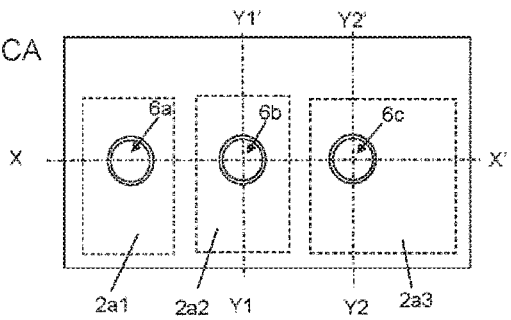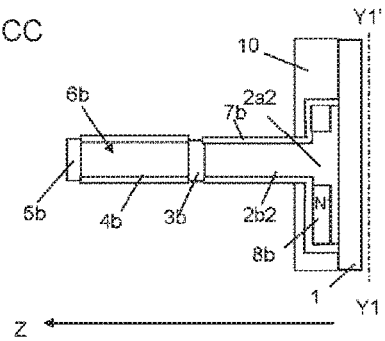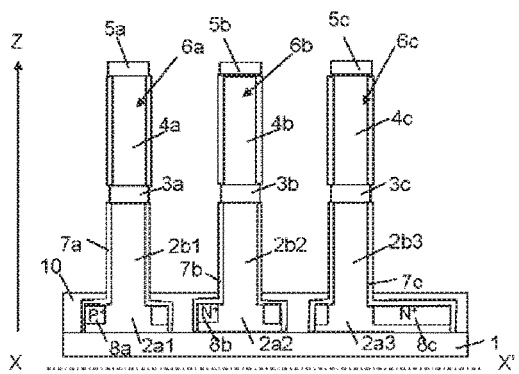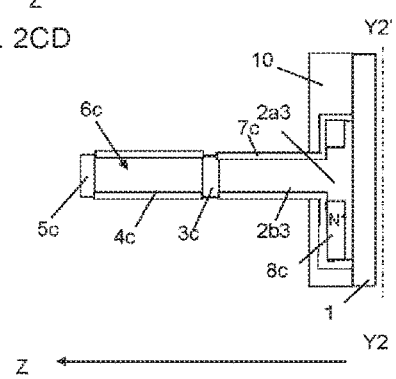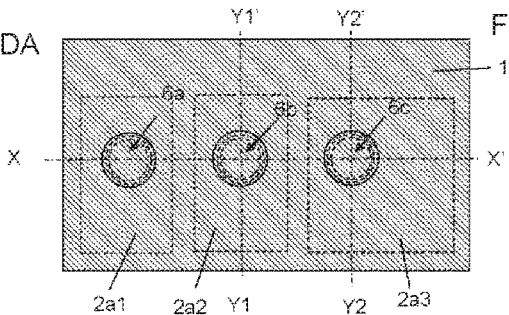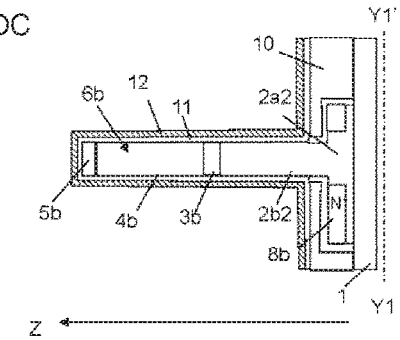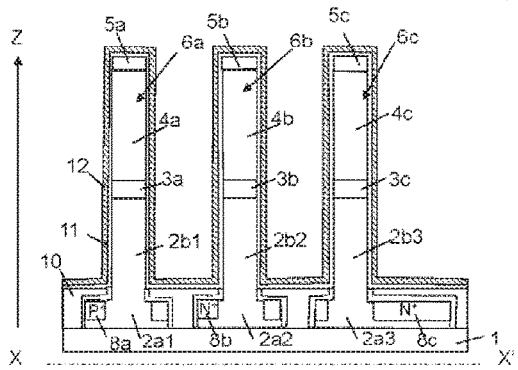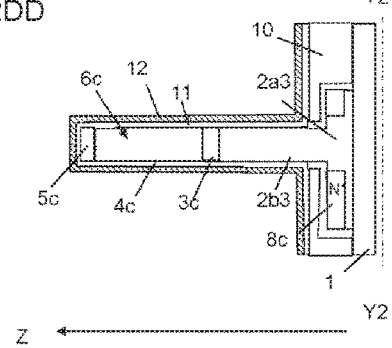

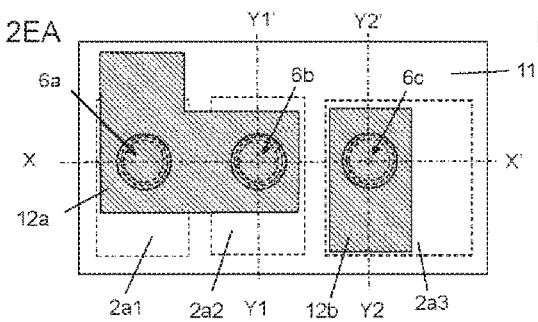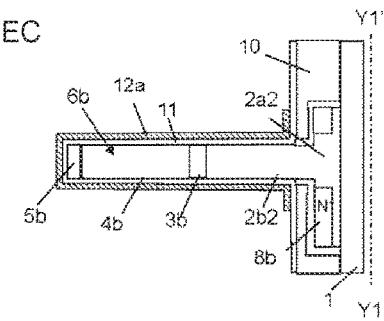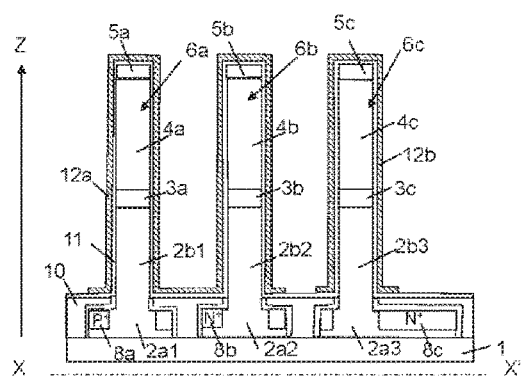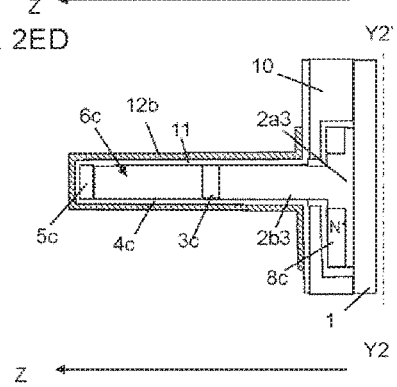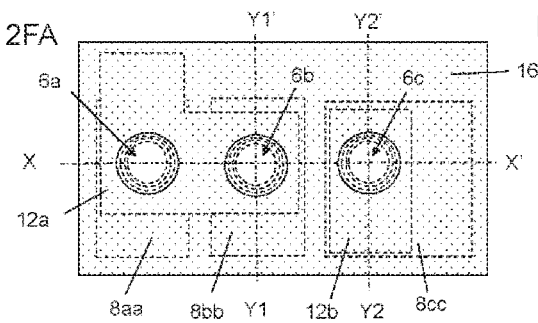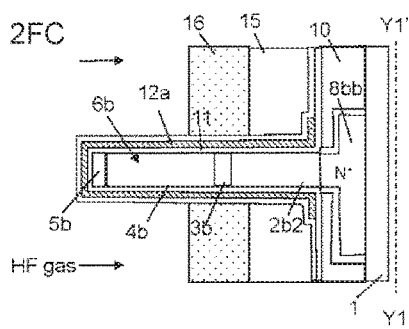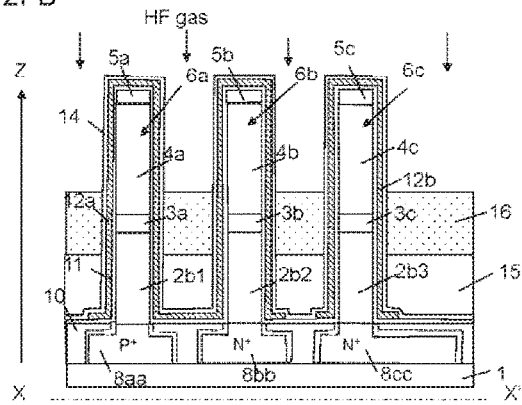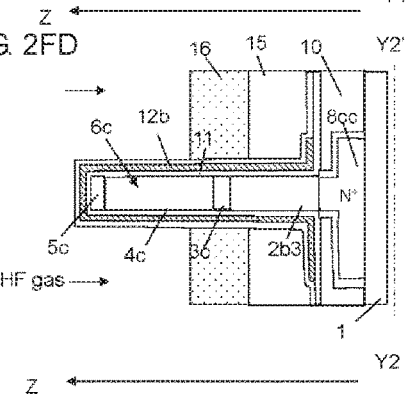

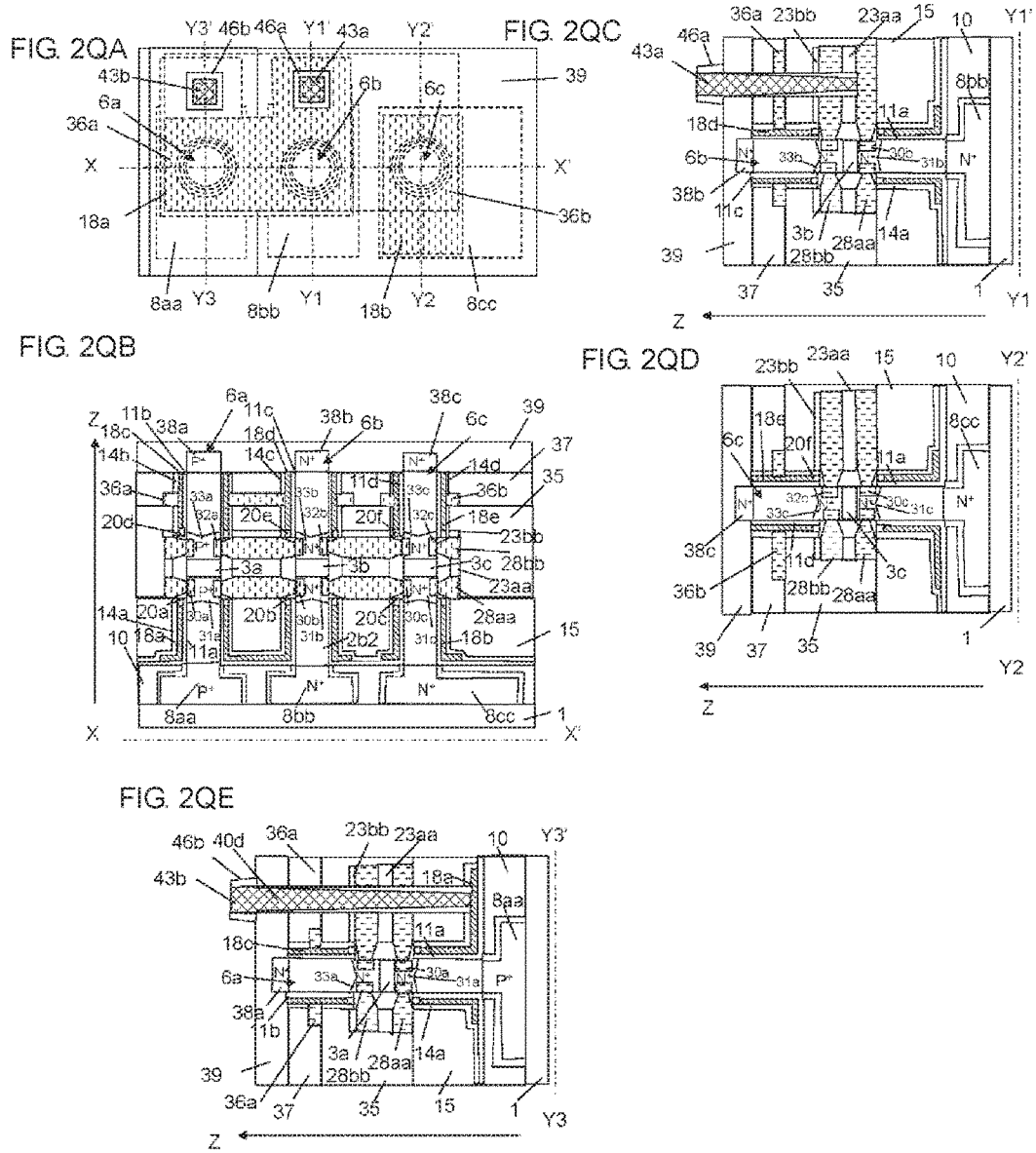

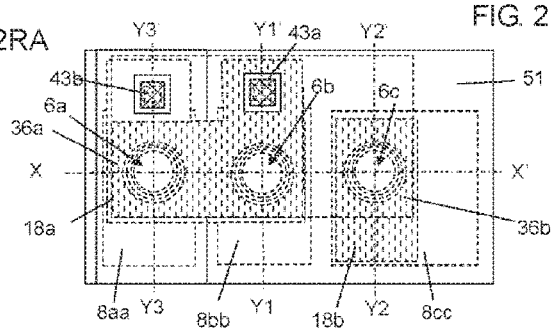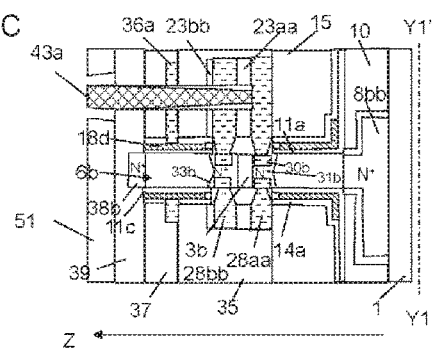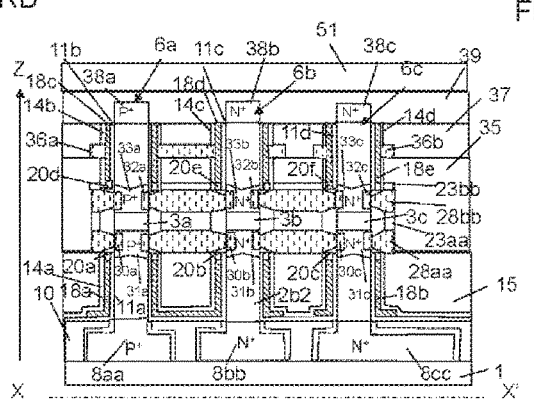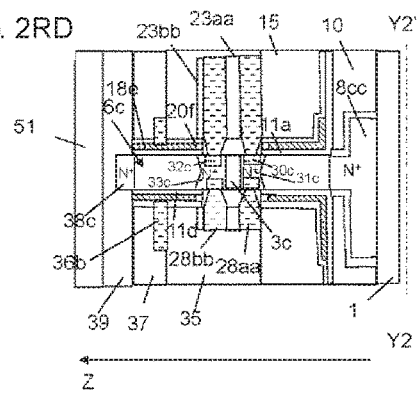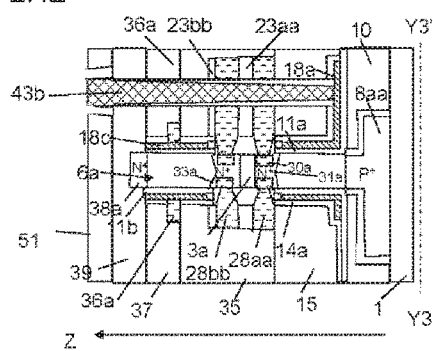

FIG. 2SA
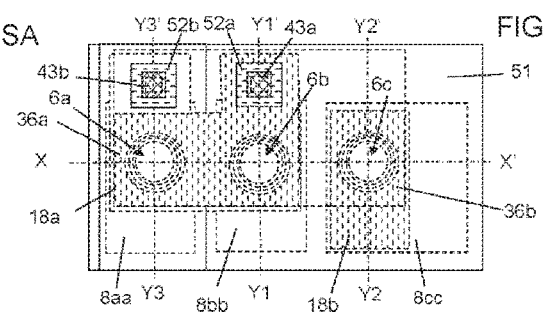
FIG. 2SC
FIG. 2SB
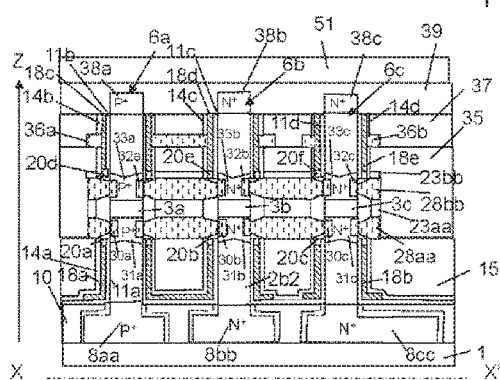
FIG. 2SD
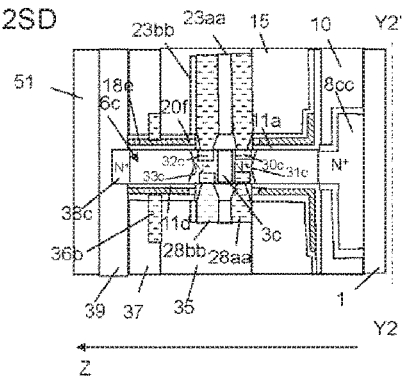
FIG. 2SE
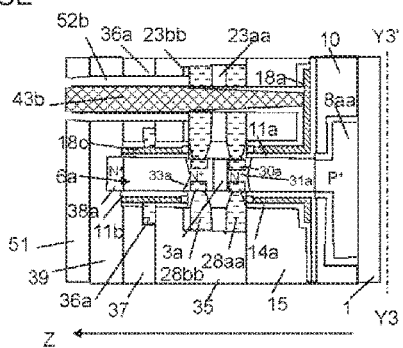

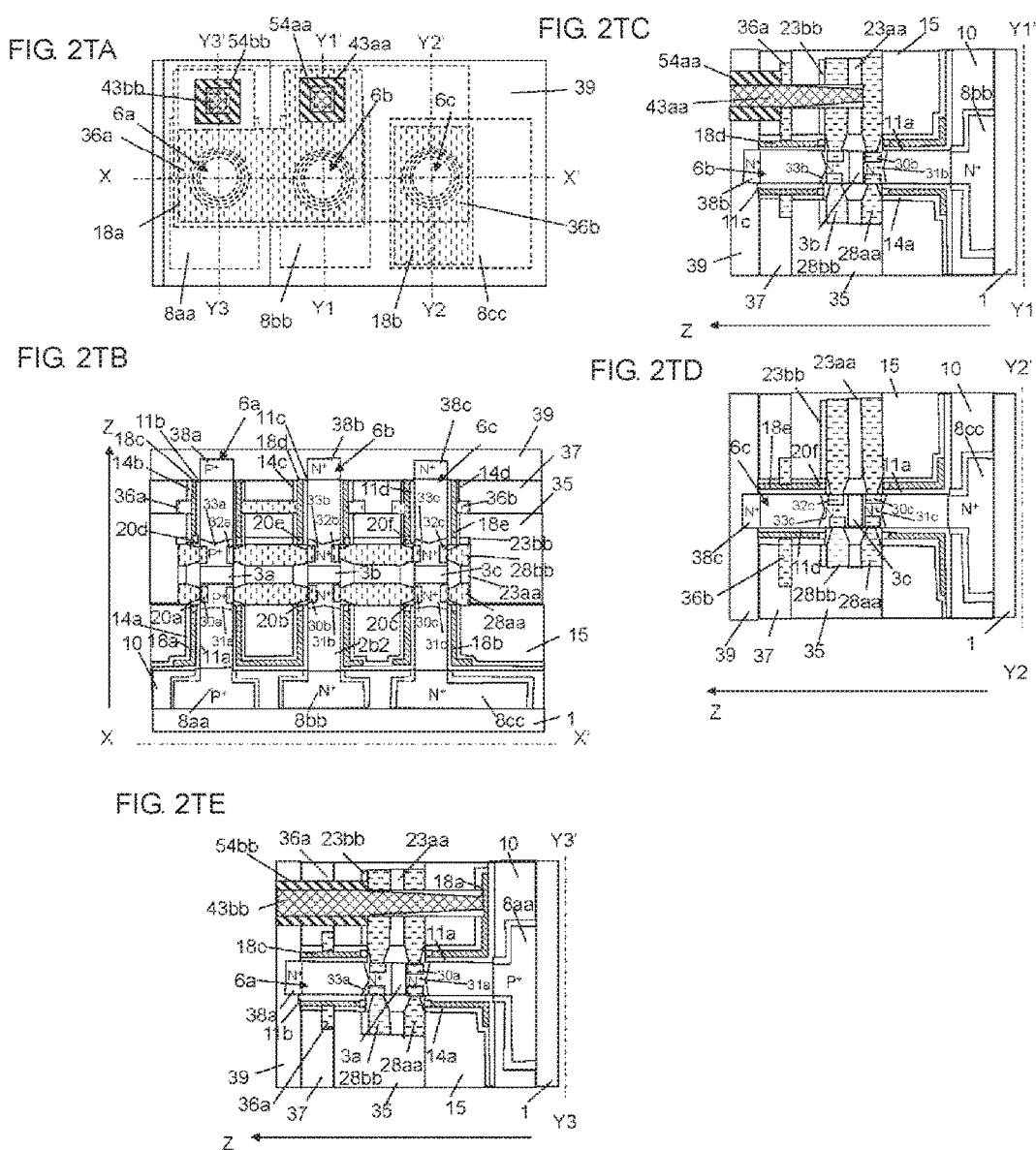

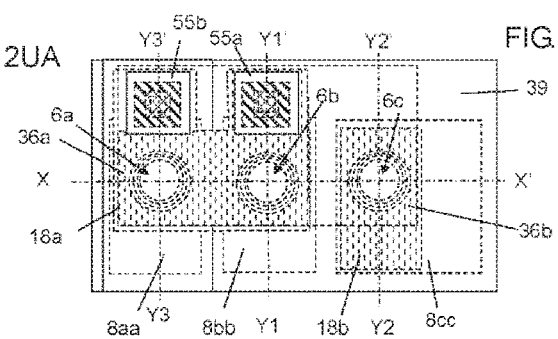
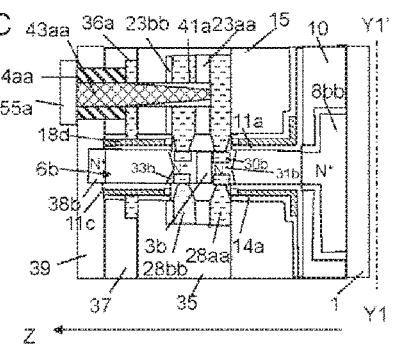
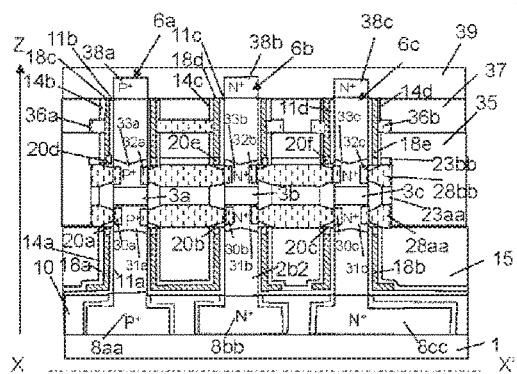
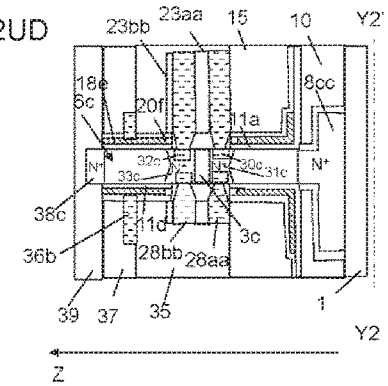
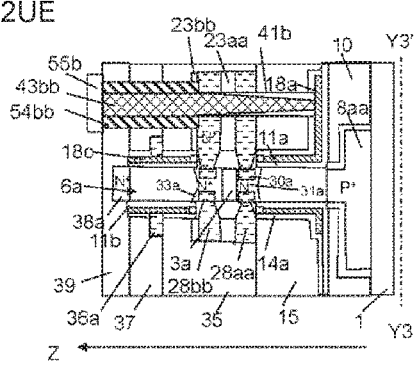

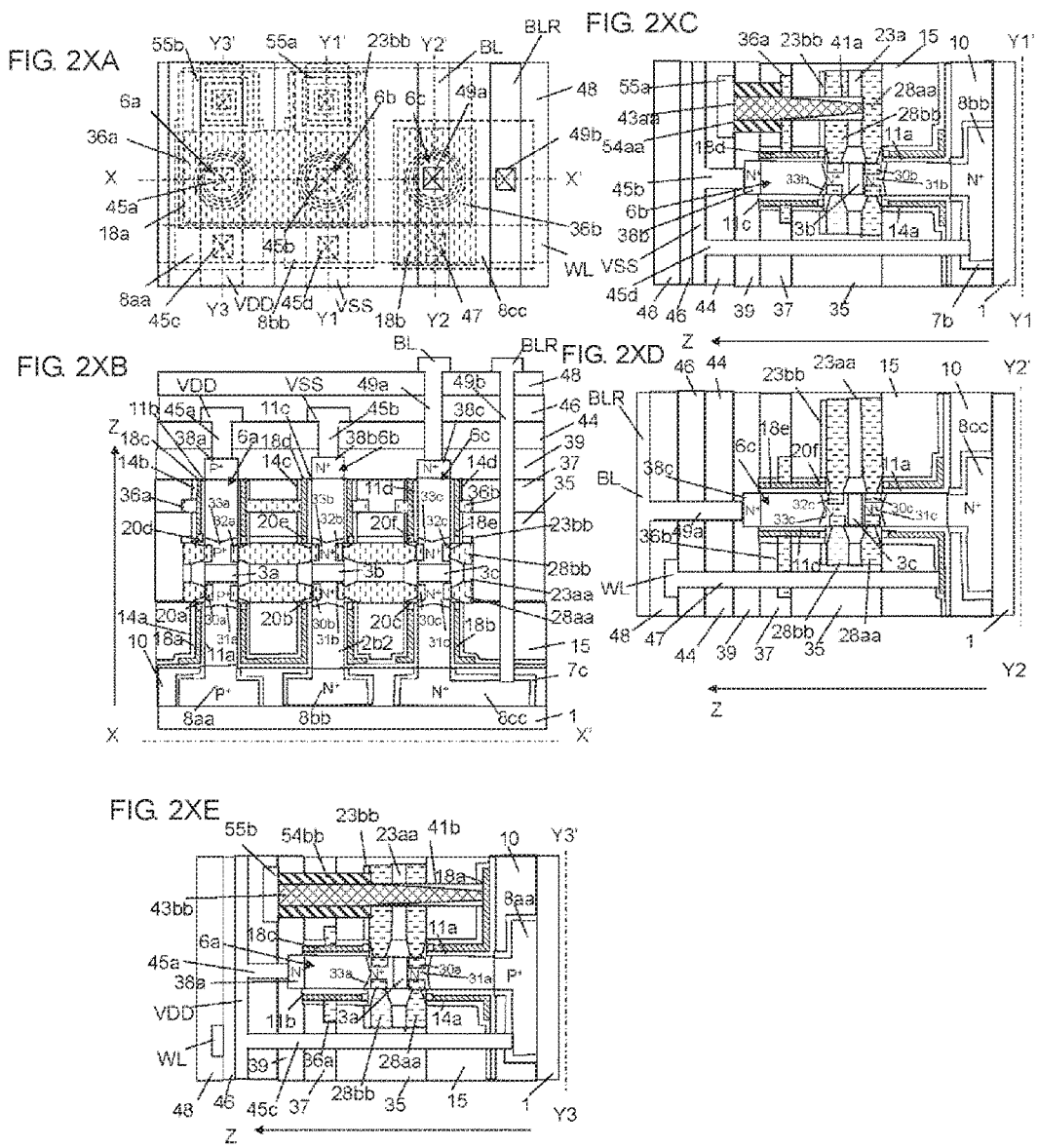

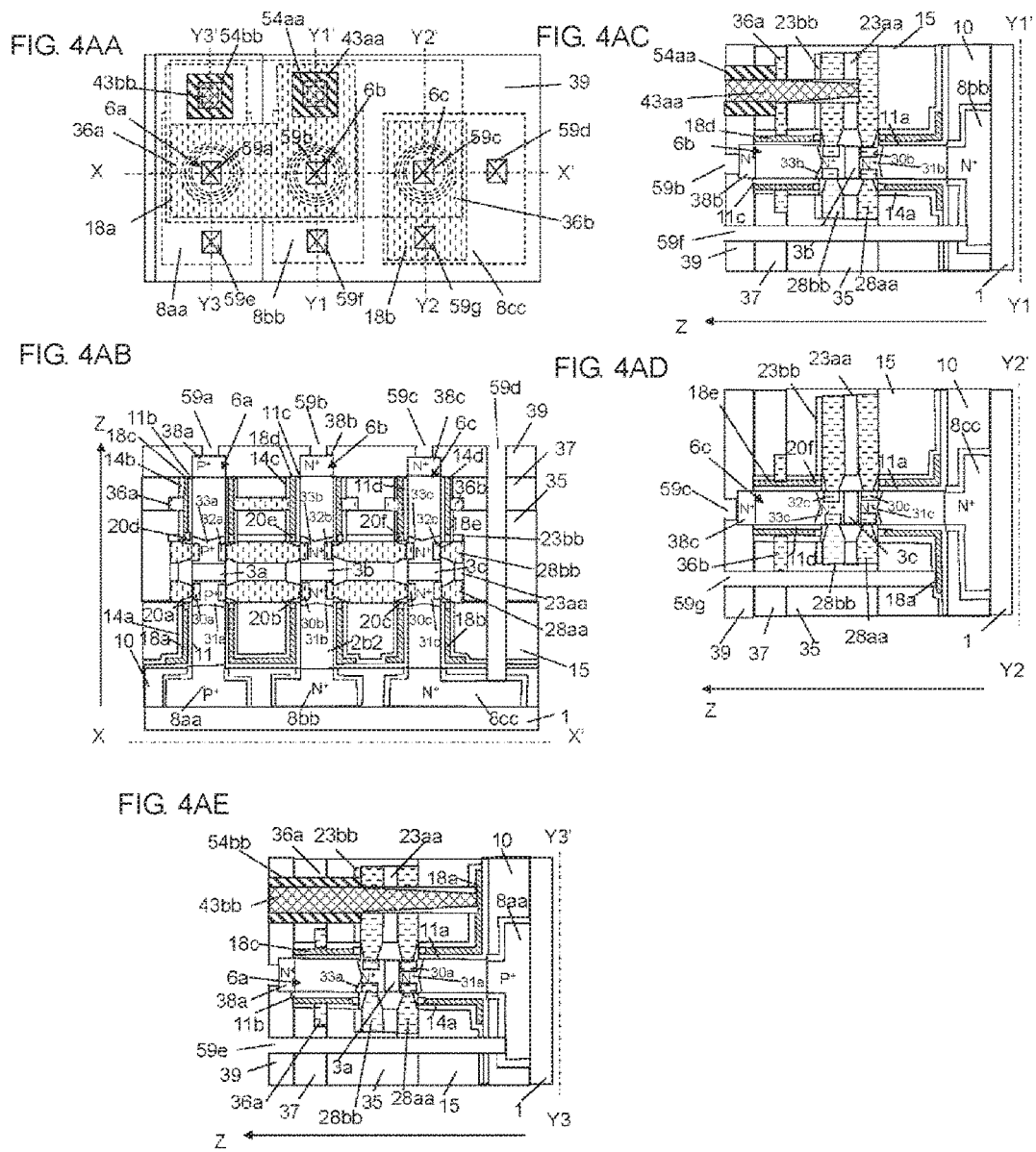

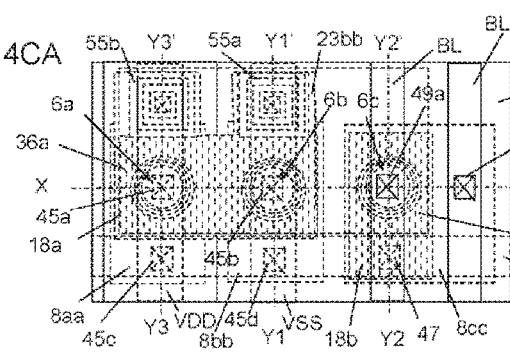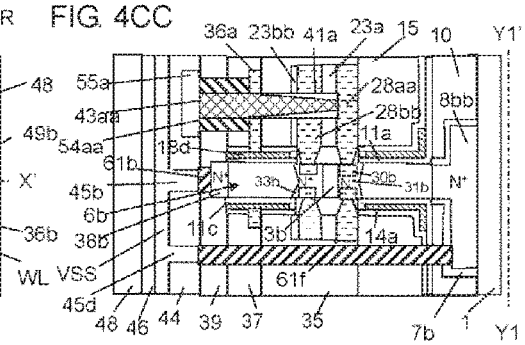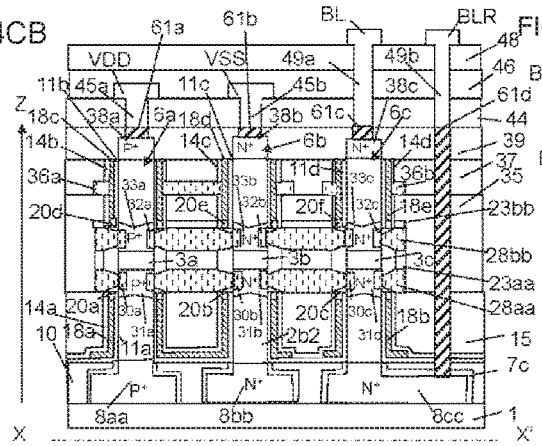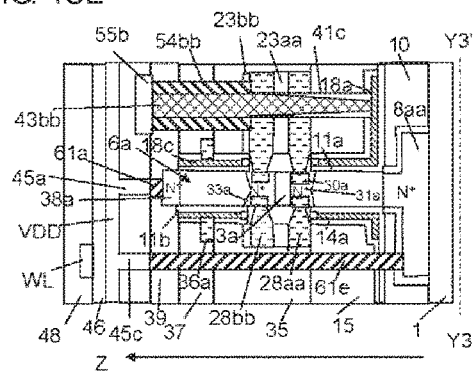

METHOD FOR PRODUCING PILLAR-SHAPED SEMICONDUCTOR DEVICE

CROSS REFERENCES TO RELATED APPLICATIONS

The present application is a continuation-in-part application of U.S. patent application Ser. No. 15/712,637, filed Sep. 22, 2017 and allowed Nov. 1, 2018, which is a continuation application of PCT/JP2016/066151, filed Jun. 1, 2016, which claims priority to PCT/JP2015/078776, filed Oct. 9, 2015. The contents of these applications are incorporated herein by reference in their entirety.

BACKGROUND OF THE INVENTION

1. Field of the Invention

The present invention relates to a method for producing a pillar-shaped semiconductor device.

2. Description of the Related Art

In these years, three-dimensional transistors have been used in LSI (Large Scale Integration). In particular, surrounding gate transistors (SGTs), which are pillar-shaped semiconductor devices, have been attracting attention as semiconductor elements that provide highly integrated semiconductor devices. There has been a demand for an SGT-including semiconductor device that has a higher degree of integration and a higher performance.

Ordinary planar MOS transistors have a channel that extends in a horizontal direction along the upper surface of the semiconductor substrate. By contrast, SGTs have a channel that extends in a direction perpendicular to the upper surface of the semiconductor substrate (for example, refer to Japanese Unexamined Patent Application Publication No. 2-188966 and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, vol. 38, No. 3, pp. 573-578 (1991)). For this reason, compared with planar MOS transistors, SGTs enable an increase in the density of semiconductor devices.

FIG. 5 is a schematic structural view of an N-channel SGT. A Si pillar 100 of a P or i (intrinsic) conductivity type (hereafter, silicon semiconductor pillars will be referred to as "Si pillars") has, in its upper and lower portions, N$^+$ layers 101$a$ and 101$b$ one of which functions as a source and the other one of which functions as a drain (hereafter, semiconductor regions containing a donor impurity at a high concentration will be referred to as "N$^+$ layers"). A portion of the Si pillar 100 between the N$^+$ layers 101$a$ and 101$b$, which function as a source and a drain, functions as a channel region 102. Around this channel region 102, a gate insulating layer 103 is formed. Around this gate insulating layer 103, a gate conductor layer 104 is formed. In the SGT, the N$^+$ layers 101$a$ and 101$b$ functioning as the source and the drain, the channel region 102, the gate insulating layer 103, and the gate conductor layer 104 are formed so as to constitute a pillar. Thus, in plan view, the area occupied by the SGT corresponds to the area occupied by a single source-or-drain N$^+$ layer of a planar MOS transistor. Therefore, compared with a circuit chip including a planar MOS transistor, an SGT-including circuit chip enables a further reduction in the size of the chip.

In the SGT illustrated in FIG. 5, a single SGT is formed within a single Si pillar. Alternatively, plural SGTs may be formed so as to be stacked within a single Si pillar. In this case, wiring conductor layers that are connected to the source/drain semiconductor regions and the gate conductor layers of SGTs and that are formed at the same heights in the perpendicular direction as the source/drain semiconductor regions, overlap in plan view. In a final step of forming the SGT circuit, the wiring conductor layers need to be connected, via contact holes formed on the wiring conductor layers, to wiring metal layers formed above the wiring conductor layers. For this reason, in order to achieve an increase in the degree of integration of an SGT circuit, how to form wiring conductor layers, contact holes, and wiring metal layers is important.

SUMMARY OF THE INVENTION

There has been a demand for a pillar-shaped semiconductor device having a higher density.

A method for producing a pillar-shaped semiconductor device according to a first aspect of the present invention includes:

a step of providing a stack structure including a semiconductor structure including at least one semiconductor pillar formed on a substrate so as to be perpendicular to a surface of the substrate, a gate insulating layer formed so as to surround an outer periphery of the at least one semiconductor pillar, a gate conductor layer formed so as to surround the gate insulating layer, a first impurity region connected to the at least one semiconductor pillar, and a second impurity region connected to the at least one semiconductor pillar so as to be separated from the first impurity region, and a first wiring conductor layer, a second wiring conductor layer, and a third wiring conductor layer that individually connect to any one of the gate conductor layer, the first impurity region, and the second impurity region of the at least one semiconductor pillar, that extend in a horizontal direction along the surface of the substrate, that at least partially overlap in plan view, and that are present in this order from a lower level to a higher level;

a step of forming a first contact region that extends through the third wiring conductor layer and the second wiring conductor layer to an upper surface or inside of the first wiring conductor layer;

a step of forming a first tubular insulating layer in a portion that is on a side surface of the first contact region and is on a side surface of the second wiring conductor layer;

a step of filling the first contact region to form a first conductor layer;

a step of exposing a top portion of the first conductor layer and subsequently forming a first material layer so as to surround the top portion of the first conductor layer;

a step of forming a first insulating layer over an entirety of the stack structure, and subsequently planarizing upper surfaces of the first conductor layer, the first material layer, and the first insulating layer so as to expose upper surfaces of the first conductor layer and the first material layer;

a step of removing the first material layer;

a step of forming a second contact region, through the first insulating layer serving as a mask, so as to extend to an upper surface of the third wiring conductor layer; and a step of filling the second contact region to form a second conductor layer.

The method for producing a pillar-shaped semiconductor device preferably further includes a step of adjusting the first conductor layer and the second conductor layer such that a level of a surface of a top portion of the first conductor layer matches with a level of a surface of a top portion of the second conductor layer.

In the method for producing a pillar-shaped semiconductor device, the step of forming the second conductor layer preferably includes filling a conductor material into the second contact region and depositing the conductor material on the first insulating layer, and subsequently subjecting the conductor material to a lithographic process and etching to form a single layer that includes the second conductor layer and a wiring conductor layer connecting to upper surfaces of the first conductor layer and the second conductor layer.

The method for producing a pillar-shaped semiconductor device preferably further includes:

a step of forming at least one third contact region that is formed, in plan view, in a position other than in the first contact region, that extends downward beyond a surface of the first insulating layer, and that connects to any one of the gate conductor layer, the first impurity region, and the second impurity region;

a step of filling the at least one third contact region to form a third conductor layer formed of a conductor material that is the same as in the first conductor layer; and a step of adjusting the first conductor layer and the third conductor layer such that a level of a surface of a top portion of the first conductor layer matches with a level of a surface of a top portion of the third conductor layer.

The first wiring conductor layer, the second wiring conductor layer, and the third wiring conductor layer are each preferably formed of metal or alloy or a semiconductor material layer containing acceptor or donor impurity.

At least any one of the first wiring conductor layer, the second wiring conductor layer, and the third wiring conductor layer preferably has a single-crystal semiconductor layer that connects to the side surface of the at least one semiconductor pillar and that contains acceptor or donor impurity.

In plan view, a portion of an outer periphery of the first contact hole region preferably overlaps at least any one of the first wiring conductor layer, the second wiring conductor layer, and the third wiring conductor layer.

The present invention provides a high-density pillar-shaped semiconductor device.

BRIEF DESCRIPTION OF THE DRAWINGS

FIGS. 2AA to 2AD are a plan view and sectional structural views that illustrate a method for producing an SGT-including pillar-shaped semiconductor device according to a first embodiment.

FIGS. 2BA to 2BD are a plan view and sectional structural views that illustrate a method for producing an SGT-including pillar-shaped semiconductor device according to a first embodiment.

FIGS. 2CA to 2CD are a plan view and sectional structural views that illustrate a method for producing an SGT-including pillar-shaped semiconductor device according to a first embodiment.

FIGS. 2DA to 2DD are a plan view and sectional structural views that illustrate a method for producing an SGT-including pillar-shaped semiconductor device according to a first embodiment.

FIGS. 2EA to 2ED are a plan view and sectional structural views that illustrate a method for producing an SGT-including pillar-shaped semiconductor device according to a first embodiment.

FIGS. 2FA to 2FD are a plan view and sectional structural views that illustrate a method for producing an SGT-including pillar-shaped semiconductor device according to a first embodiment.

FIGS. 2QA to 2QE are a plan view and sectional structural views that illustrate a method for producing an SGT-including pillar-shaped semiconductor device according to a first embodiment.

FIGS. 2RA to 2RE are a plan view and sectional structural views that illustrate a method for producing an SGT-including pillar-shaped semiconductor device according to a first embodiment.

FIGS. 2SA to 2SE are a plan view and sectional structural views that illustrate a method for producing an SGT-including pillar-shaped semiconductor device according to a first embodiment.

FIGS. 2TA to 2TE are a plan view and sectional structural views that illustrate a method for producing an SGT-including pillar-shaped semiconductor device according to a first embodiment.

FIGS. 2UA to 2UE are a plan view and sectional structural views that illustrate a method for producing an SGT-including pillar-shaped semiconductor device according to a first embodiment.

FIGS. 2XA to 2XE are a plan view and sectional structural views that illustrate a method for producing an SGT-including pillar-shaped semiconductor device according to a first embodiment.

FIGS. 4AA to 4AE are a plan view and sectional structural views that illustrate a method for producing an SGT-including pillar-shaped semiconductor device according to a third embodiment of the present invention.

FIGS. 4CA to 4CE are a plan view and sectional structural views that illustrate a method for producing an SGT-including pillar-shaped semiconductor device according to a third embodiment.

DESCRIPTION OF THE PREFERRED EMBODIMENTS

Hereinafter, methods for producing pillar-shaped semiconductor devices according to embodiments of the present invention will be described with reference to drawings.

First Embodiment

Hereinafter, referring to FIGS. 1A, 1B, and 2AA to 2XE, a method for producing an SGT-including pillar-shaped semiconductor device according to a first embodiment of the present invention will be described.

Figure 1A:
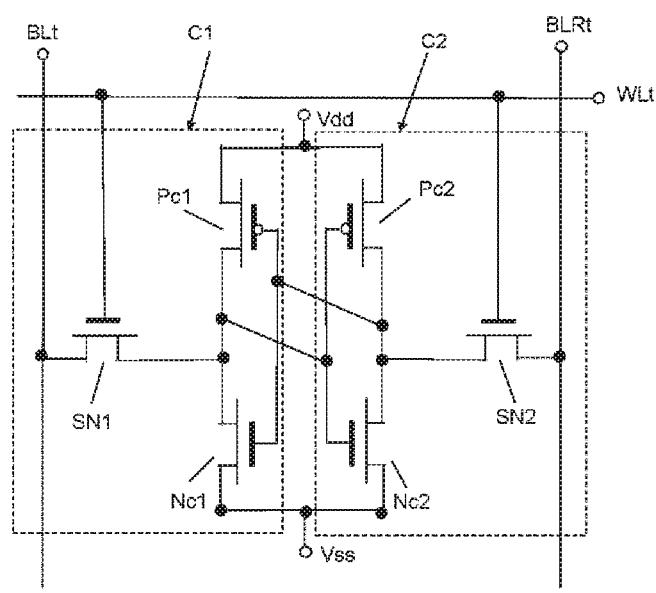
FIG. 1A is an SRAM cell circuit diagram that illustrates an SGT-including pillar-shaped semiconductor memory device according to a first embodiment of the present invention.

FIG. 1A illustrates a pillar-shaped semiconductor device according to this embodiment, that is, an SRAM cell circuit including SGTs. This SRAM cell circuit includes two inverter circuits. One of the inverter circuits is constituted by a P-channel SGT Pc1 serving as a load transistor, and an N-channel SGT Nc1 serving as a drive transistor. The other inverter circuit is constituted by a P-channel SGT Pc2 serving as a load transistor, and an N-channel SGT Nc2 serving as a drive transistor. The gate of the P-channel SGT Pc1, the gate of the N-channel SGT Nc1, the drain of the P-channel SGT Pc2, and the drain of the N-channel SGT Nc2 are connected together. The gate of the P-channel SGT Pc2, the gate of the N-channel SGT Nc2, the drain of the P-channel SGT Pc1, and the drain of the N-channel SGT Nc1 are connected together.

As illustrated in FIG. 1A, the sources of the P-channel SGTs Pc1 and Pc2 are connected to a power supply terminal Vdd. The sources of the N-channel SGTs Nc1 and Nc2 are connected to a ground terminal Vss. Selection N-channel SGTs SN1 and SN2 are disposed on both sides of the two inverter circuits. The gates of the selection N-channel SGTs SN1 and SN2 are connected to a word line terminal WLt. The source and drain of the selection N-channel SGT SN1 are connected to a bit line terminal BLt and the drains of the N-channel SGT Nc1 and the P-channel SGT Pc1. The source and drain of the selection N-channel SGT SN2 are connected to an inverted bit line terminal BLRt and the drains of the N-channel SGT Nc2 and the P-channel SGT Pc2. Thus, the circuit including an SRAM cell (hereafter, referred to as an "SRAM cell circuit") according to this embodiment is constituted by, in total, six SGTs that are two P-channel SGTs Pc1 and Pc2 and four N-channel SGTs Nc1, Nc2, SN1, and SN2. This SRAM cell circuit is constituted by a circuit area C1, which is constituted by the P-channel SGT Pc1 and the N-channel SGTs Nc1 and SN1, and a circuit area C2, which is constituted by the P-channel SGT Pc2 and the N-channel SGTs Nc2 and SN2.

Figure 1B:
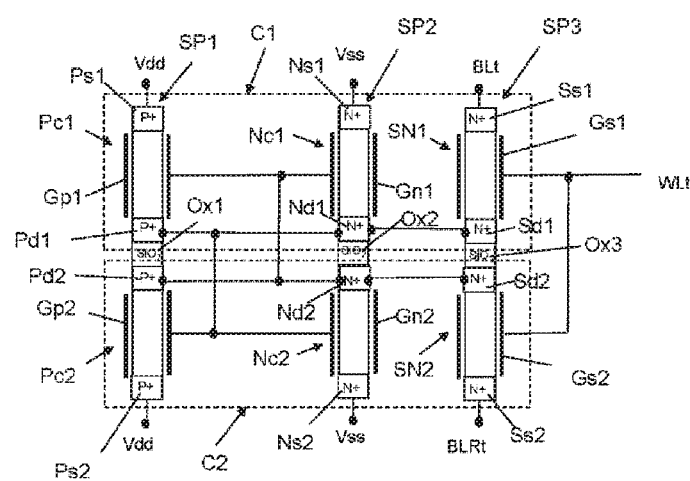
FIG. 1B is an SRAM cell schematic structural view that illustrates an SGT-including pillar-shaped semiconductor memory device according to a first embodiment.

FIG. 1B is a schematic structural view of the SRAM cell circuit according to the first embodiment. This SRAM cell circuit is constituted by three Si pillars SP1, SP2, and SP3.

In the Si pillar SP1, the P-channel SGT Pc1 in FIG. 1A is formed in an upper portion, and the P-channel SGT Pc2 in FIG. 1A is formed in a lower portion. The P-channel SGTs Pc1 and Pc2 are isolated from each other by a $SiO_2$ layer Ox1, which is formed in an intermediate portion of the Si pillar SP1. The P-channel SGT Pc1 is constituted by a channel portion of the Si pillar SP1, a gate Gp1 surrounding this portion of the Si pillar SP1, and a drain $P^+$ layer Pd1 and a source $P^+$ layer Ps1, which are present over and under the gate Gp1 and within the Si pillar SP1. The P-channel SGT Pc2 is constituted by a channel portion of the Si pillar SP1, a gate Gp2 surrounding this portion of the Si pillar SP1, and a drain $P^+$ layer Pd2 and a source $P^+$ layer Ps2, which are present over and under the gate Gp2 and within the Si pillar SP1.

In the Si pillar SP2, the N-channel SGT Nc1 in FIG. 1A is formed in an upper portion, and the N-channel SGT Nc2 in FIG. 1A is formed in a lower portion. The N-channel SGTs Nc1 and Nc2 are isolated from each other by a $SiO_2$ layer Ox2, which is formed in an intermediate portion of the Si pillar SP2. The N-channel SGT Nc1 is constituted by a channel portion of the Si pillar SP2, a gate Gn1 surrounding this portion of the Si pillar SP2, and a drain $N^+$ layer Nd1 and a source $N^+$ layer Ns1, which are formed over and under the gate Gn1 and within the Si pillar SP2. The N-channel SGT Nc2 is constituted by a channel portion of the Si pillar SP2, a gate Gn2 surrounding this portion of the Si pillar SP2, and a drain $N^+$ layer Nd2 and a source $N^+$ layer Ns2, which are formed over and under the gate Gn2 and within the Si pillar SP2.

In the Si pillar SP3, the N-channel SGT SN1 in FIG. 1A is formed in an upper portion, and the N-channel SGT SN2 in FIG. 1A is formed in a lower portion. The N-channel SGTs SN1 and SN2 are isolated from each other by a $SiO_2$ layer Ox3, which is formed in an intermediate portion of the Si pillar SP3. The N-channel SGT SN1 is constituted by a channel portion of the Si pillar SP3, a gate Gs1 surrounding this portion of the Si pillar SP3, and a drain $N^+$ layer Sd1 and a source $N^+$ layer Ss1, which are formed over and under the gate Gs1 and within the Si pillar SP3. The N-channel SGT SN2 is constituted by a channel portion of the Si pillar SP3, a gate Gs2 surrounding this portion of the Si pillar SP3, and a drain $N^+$ layer Sd2 and a source $N^+$ layer Ss2, which are formed over and under the gate Gs2 and within the Si pillar SP3.

As illustrated in FIG. 1B, components positioned at the same heights are connected to each other in the Si pillars SP1, SP2, and SP3. Specifically, the gates Gp1 and Gn1 are connected to each other; the drain $P^+$ layer Pd1, the drain $N^+$ layer Nd1, and the drain $N^+$ layer Sd1 are connected together; the drain $P^+$ layer Pd2, the drain $N^+$ layer Nd2, and the drain $N^+$ layer Sd2 are connected together; and the gates Gp2 and Gn2 are connected to each other. Furthermore, the gates Gp1 and Gn1, the drain $P^+$ layer Pd2, the drain $N^+$ layer Nd2, and the drain $N^+$ layer Sd2 are connected together; and the gates Gp2 and Gn2, the drain $P^+$ layer Pd1, the drain $N^+$ layer Nd1, and the drain $N^+$ layer Sd1 are connected together.

As illustrated in FIG. 1B, the source $P^+$ layers Ps1 and Ps2 in the Si pillar SP1 are connected to the power supply terminal Vdd; the source $N^+$ layers Ns1 and Ns2 in the Si pillar SP2 are connected to the ground terminal Vss; the source $N^+$ layer Ss1 in the Si pillar SP3 is connected to the bit line terminal BLt; the source $N^+$ layer Ss2 in the Si pillar SP3 is connected to the inverted bit line terminal BLRt; and the gates Gs1 and Gs2 in the Si pillar SP3 are connected to the word line terminal WLt.

As illustrated in FIG. 1B, the circuit area C1 in the circuit diagram in FIG. 1A is formed in an upper portion of the Si pillars SP1, SP2, and SP3, and the circuit area C2 in the circuit diagram in FIG. 1A is formed in a lower portion of the Si pillars SP1, SP2, and SP3. Components at the same heights in the Si pillars SP1, SP2, and SP3 are connected to each other without a vertical connection path between Si pillars. Specifically, the gates Gp1 and Gn1 are connected to each other without a vertical connection path between the Si pillars SP1 and SP2; the drain $P^+$ layer Pd1 and the drain $N^+$ layers Nd1 and Sd1 are connected together without vertical connection paths between the Si pillars SP1, SP2, and SP3; the drain $P^+$ layer Pd2 and the drain $N^+$ layers Nd2 and Sd2 are connected together without vertical connection paths between the Si pillars SP1, SP2, and SP3; similarly, the gates Gp2 and Gn2 are connected to each other without a vertical connection path between the Si pillars SP1 and SP2. By contrast, the connection of the gates Gp1 and Gn1 to the drain $P^+$ layer Pd2 and the drain $N^+$ layer Nd2 needs to be formed via a vertical connection wiring path. Similarly, the connection of the gates Gp2 and Gn2 to the drain $P^+$ layer Pd1 and the drain $N^+$ layer Nd1 is formed via a vertical connection wiring path.

FIGS. 2AA to 2AD are a plan view and sectional views for illustrating a step for producing an SRAM cell circuit that is an SGT-including pillar-shaped semiconductor device. Among FIG. 2AA to FIG. 2XD, figures suffixed with A are plan views; figures suffixed with B are sectional structural views taken along lines X-X' in the corresponding figures suffixed with A; figures suffixed with C are sectional structural views taken along lines Y1-Y1' in the corresponding figures suffixed with A; and figures suffixed with D are sectional structural views taken along lines Y2-Y2' in the corresponding figures suffixed with A.

As illustrated in FIGS. 2AA to 2AD, on a $SiO_2$ layer substrate 1, an i layer 2, a $SiO_2$ layer 3, an i layer 4, and a $SiO_2$ layer 5 are formed so as to be stacked.

Subsequently, as illustrated in FIGS. 2BA to 2BD, a lithographic process and an RIE (Reactive Ion Etching) process are carried out through a resist layer (not shown) serving as a mask to form $SiO_2$ layers 5a, 5b, and 5c, which are circular in plan view. Subsequently, an RIE process is carried out through the resist layer and the $SiO_2$ layers 5a, 5b, and 5c serving as masks to etch the i layer 4, the $SiO_2$ layer 3, and the i layer 2 such that a lower layer of the i layer 2 is left on the $SiO_2$ layer substrate 1 to thereby form Si pillars 6a, 6b, and 6c. Subsequently, the resist layer is removed. As a result, the Si pillar 6a is formed so as to include an i layer 2b1, a $SiO_2$ layer 3a, an i layer 4a, and a $SiO_2$ layer 5a; the Si pillar 6b is formed so as to include an i layer 2b2, a $SiO_2$ layer 3b, an i layer 4b, and a $SiO_2$ layer 5b; and the Si pillar 6c is formed so as to include an i layer 2b3, a $SiO_2$ layer 3c, an i layer 4c, and a $SiO_2$ layer 5c.

Subsequently, a lithographic process and an RIE process are carried out to etch the i layer 2 remaining as a lower layer, to thereby form an i layer 2a1 in an outer peripheral portion around the Si pillar 6a, an i layer 2a2 in an outer peripheral portion around the Si pillar 6b, and an i layer 2a3 in an outer peripheral portion around the Si pillar 6c.

Subsequently, as illustrated in FIGS. 2CA to 2CD, for example, thermal oxidation is carried out, to thereby form $SiO_2$ layers 7a, 7b, and 7c on the outer peripheries of the Si pillars 6a, 6b, and 6c and the i layers 2a1, 2a2, and 2a3. Subsequently, a lithographic process and an ion implantation process are carried out such that a $P^+$ layer 8a is formed in the i layer 2a1 in the outer peripheral portion around the Si pillar 6a, an $N^+$ layer 8b is formed in the i layer 2a2 in the outer peripheral portion around the Si pillar 6b, and an $N^+$ layer 8c is formed in the i layer 2a3 in the outer peripheral portion around the Si pillar 6c. Subsequently, a $SiO_2$ layer 10 is formed so as to surround lower portions of the Si pillars 6a, 6b, and 6c and surround the i layers 2a1, 2a2, and 2a3.

Subsequently, as illustrated in FIGS. 2DA to 2DD, portions of the $SiO_2$ layers 7a, 7b, and 7c above the $SiO_2$ layer 10 are removed. Subsequently, a hafnium oxide ($HfO_2$) layer 11 and a titanium nitride (TiN) layer 12 are sequentially formed so as to cover the Si pillars 6a, 6b, and 6c and the $SiO_2$ layer 10 by, for example, ALD (Atomic Layer Deposition) processes. In the end, the $HfO_2$ layer 11 will function as gate insulating layers of SGTs; and the TiN layer 12 will function as gate conductor layers of SGTs.

Subsequently, as illustrated in FIGS. 2EA to 2ED, a lithographic process and an RIE process are carried out to form a TiN layer 12a surrounding the Si pillars 6a and 6b, and a TiN layer 12b surrounding the Si pillar 6c.

Subsequently, as illustrated in FIGS. 2FA to 2FD, a $SiO_2$ layer 14 is formed so as to cover the whole structure. Subsequently, a heat treatment is carried out to thermally diffuse the donor/acceptor impurity atoms in the $P^+$ layer 8a and the $N^+$ layers 8b and 8c to the entirety of the i layers 2a1, 2a2, and 2a3, to thereby form a $P^+$ layer 8aa and $N^+$ layers 8bb and 8cc. Subsequently, a silicon nitride (SiN) layer 15 is formed around the outer peripheries of the Si pillars 6a, 6b, and 6c. Subsequently, a resist layer 16 is formed on the SiN layer 15. The resist layer 16 is formed such that the $SiO_2$ layers 3a, 3b, and 3c are positioned in the center portions (in the vertical direction) of the resist layer 16. The resist layer 16 is formed in the following manner: a resist material is applied to the Si pillars 6a, 6b, and 6c and the upper surface of the SiN layer 15; subsequently, a heat treatment at 200° C., for example, is carried out to enhance the fluidity of the resist material, so that the resist material is uniformly distributed around the Si pillars 6a, 6b, and 6c and over the SiN layer 15. Subsequently, a hydrogen fluoride gas (hereafter, referred to as an "HF gas") is supplied to the whole structure. Subsequently, an environment of heating at 180°

C., for example, is provided, so that the HF gas is ionized due to moisture contained within the resist layer 16, to form hydrogen fluoride ions ($HF_2^+$) (hereafter, referred to as "HF ions"). These HF ions diffuse through the resist layer 16 to etch portions of the $SiO_2$ layer 14 that are in contact with the resist layer 16 (regarding the mechanism of this etching, refer to Tadashi Shibata, Susumu Kohyama and Hisakazu Iizuka: "A New Field Isolation Technology for High Density MOS LSI", Japanese Journal of Applied Physics, Vol. 18, pp. 263-267 (1979)). On the other hand, the other portions of the $SiO_2$ layer 14 that are not in contact with the resist layer 16 are substantially left without being etched. Subsequently, the resist layer 16 is removed.

Figure 2G:
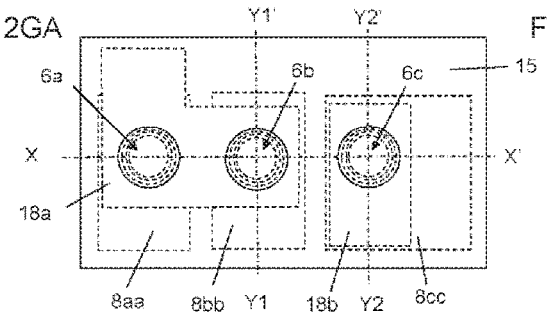
FIGS. 2GA to 2GD are a plan view and sectional structural views that illustrate a method for producing an SGT-including pillar-shaped semiconductor device according to a first embodiment.
Figure 2G:
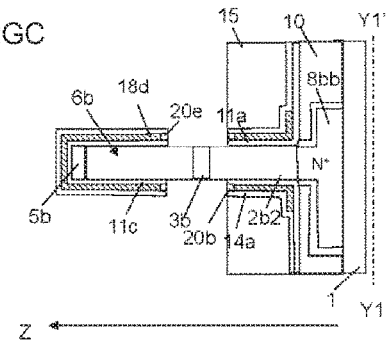
Figure 2G:
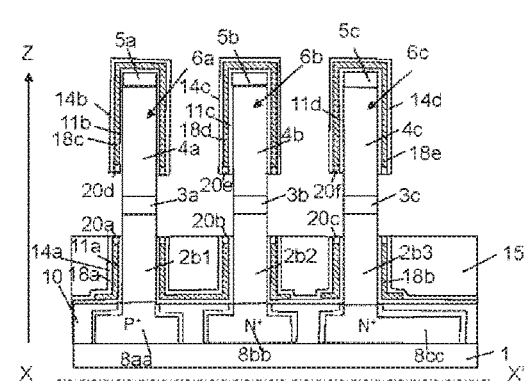
Figure 2G:
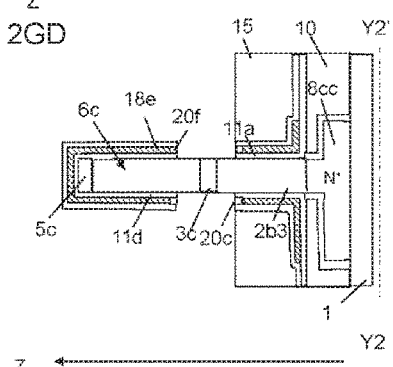

As a result, as illustrated in FIGS. 2GA to 2GD, the $SiO_2$ layer 14 is divided into a $SiO_2$ layer 14a, which is covered by the SiN layer 15, and $SiO_2$ layers 14b, 14c, and 14d, which are upper regions in the Si pillars 6a, 6b, and 6c. Subsequently, the TiN layers 12a and 12b are etched through the $SiO_2$ layers 14a, 14b, 14c, and 14d and the SiN layer 15 serving as masks. As a result, the TiN layer 12a is divided into a TiN layer 18a, which is in lower regions around the Si pillars 6a and 6b and covered by the SiN layer 15, a TiN layer 18c, which is covered by the $SiO_2$ layer 14b, and a TiN layer 18d, which is covered by the $SiO_2$ layer 14c; and the TiN layer 12b is divided into a TiN layer 18b, which is in a lower region around the Si pillar 6c and covered by the SiN layer 15, and a TiN layer 18e, which is covered by the $SiO_2$ layer 14d. Subsequently, the $HfO_2$ layer 11 is etched through the $SiO_2$ layers 14a, 14b, and 14c and the TiN layers 18a, 18b, 18c, 18d, and 18e serving as masks. As a result, the $HfO_2$ layer 11 is divided into a $HfO_2$ layer 11a, which is in lower regions around the Si pillars 6a, 6b, and 6c and covered by the TiN layers 18a and 18b, and $HfO_2$ layers 11b, 11c, and 11d, which are in upper regions around the Si pillars 6a, 6b, and 6c and respectively covered by the TiN layers 18c, 18d, and 18e. Subsequently, an exposed portion of the TiN layer 18a around the Si pillar 6a, an exposed portion of the TiN layer 18a around the Si pillar 6b, and the exposed portions of the TiN layers 18b, 18c, 18d, and 18e are oxidized to thereby form TiO (titanium oxide) layers 20a, 20b, 20c, 20d, 20e, and 20f. Subsequently, $SiO_2$ layers (not shown) are removed that are formed on the side surfaces of the Si pillars 6a, 6b, and 6c during formation of the TiO layers 20a, 20b, 20c, 20d, 20e, and 20f.

Figure 2H:
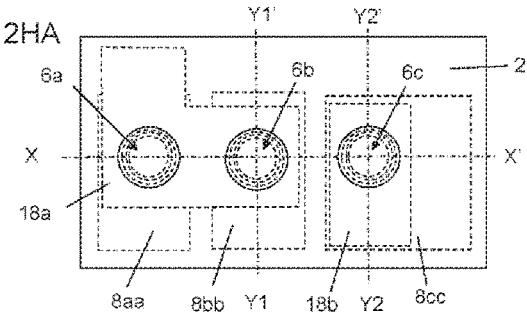
FIGS. 2HA to 2HD are a plan view and sectional structural views that illustrate a method for producing an SGT-including pillar-shaped semiconductor device according to a first embodiment.
Figure 2H:
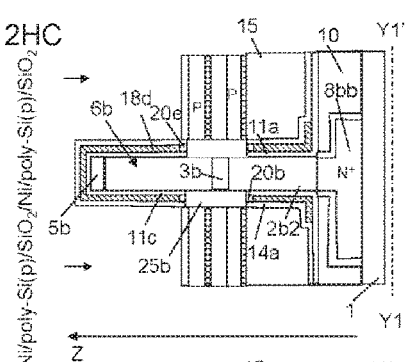
Figure 2H:
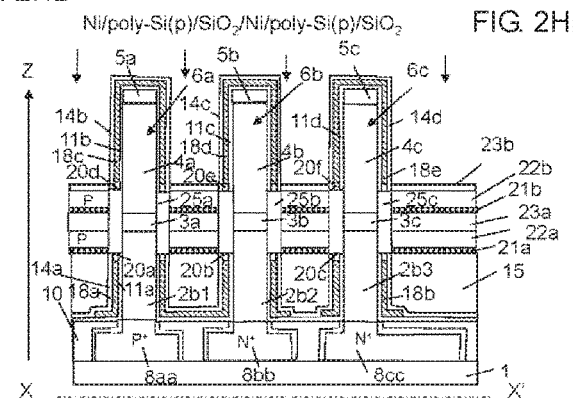
Figure 2H:
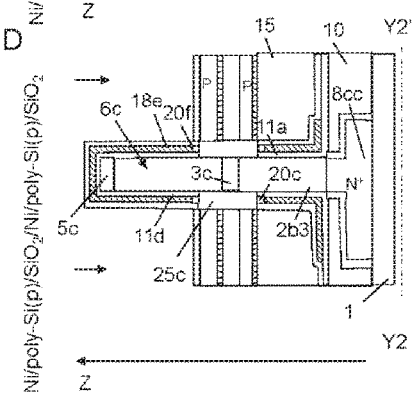

Subsequently, as illustrated in FIGS. 2HA to 2HD, for example, a bias sputtering process is carried out in the following manner: a substrate metal plate on which the $SiO_2$ layer substrate 1 is disposed and an opposite metal plate separated from the substrate metal plate are prepared; a direct-current voltage is applied to the substrate metal plate, and an RF voltage is applied across these two parallel metal plates, to thereby sputter the material atoms of the opposite metal plate onto the $SiO_2$ layer substrate 1. In this way, Ni atoms are directed to, in a direction perpendicular to, the upper surface of the $SiO_2$ layer substrate 1, to thereby form a Ni layer 21a on the SiN layer 15. Similarly, bias sputtering processes are carried out to thereby sequentially stack the following layers: a P-type poly-Si layer 22a containing boron (B) as an impurity, a $SiO_2$ layer 23a, a Ni layer 21b, a P-type poly-Si layer 22b, and a $SiO_2$ layer 23b. Incidentally, the $SiO_2$ layer 23b is formed such that its upper surface is in contact with the $SiO_2$ layers 14b, 14c, and 14d, which cover upper portions of the Si pillars 6a, 6b, and 6c. The Ni atoms, the poly-Si atoms, and the $SiO_2$ atoms are directed to, in a direction perpendicular to, the upper surface of the $SiO_2$ layer substrate 1. As a result, sealed spaces 25a, 25b, and 25c are formed between the outer peripheral side surfaces of the Si pillars 6a, 6b, and 6c and the Ni layers 21a and 21b, the P-type poly-Si layers 22a and 22b, and the $SiO_2$ layers 23a and 23b. Subsequently, stacked films (not shown) are removed that are formed over the top of the Si pillars 6a, 6b, and 6c during formation of the stacked films on the SiN layer 15 that are constituted by the Ni layers 21a and 21b, the P-type poly-Si layers 22a and 22b, and the $SiO_2$ layers 23a and 23b.

Figure 2I:
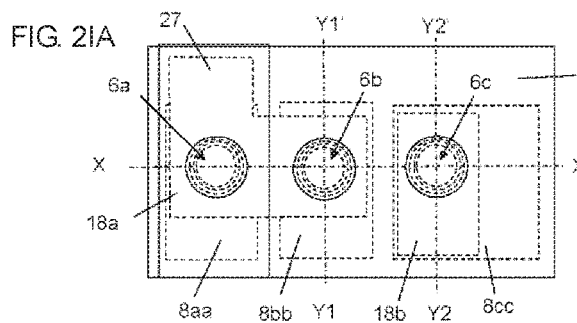
FIGS. 2IA to 2ID are a plan view and sectional structural views that illustrate a method for producing an SGT-including pillar-shaped semiconductor device according to a first embodiment.
Figure 2I:
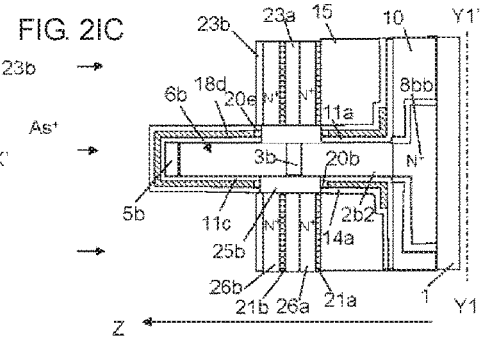
Figure 2I:
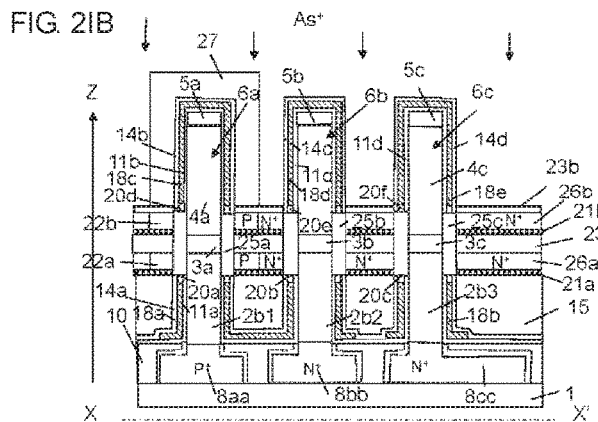
Figure 2I:
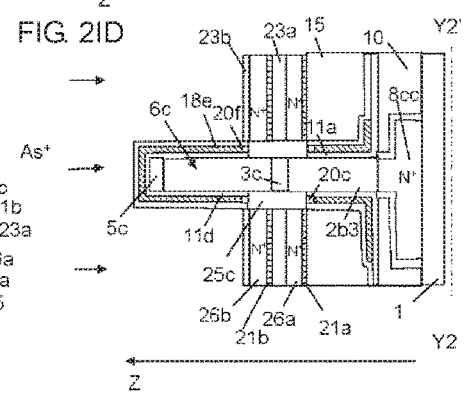

Subsequently, as illustrated in FIGS. 2IA to 2ID, a resist layer 27 is formed so as to cover the Si pillar 6a. Subsequently, ion implantation of arsenic (As) atoms is carried out from above the upper surface of the $SiO_2$ layer substrate 1, to thereby turn the P-type poly-Si layers 22a and 22b in the outer peripheral portions around the Si pillars 6b and 6c, into $N^+$ layers. Thus, $N^+$-type poly-Si layers 26a and 26b are formed. Subsequently, the resist layer 27 is removed.

Figure 2J:
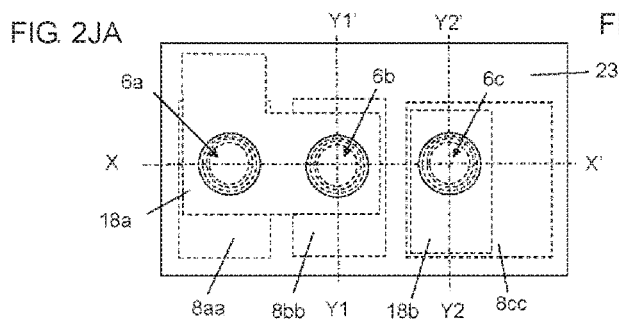
FIGS. 2JA to 2JD are a plan view and sectional structural views that illustrate a method for producing an SGT-including pillar-shaped semiconductor device according to a first embodiment.
Figure 2J:
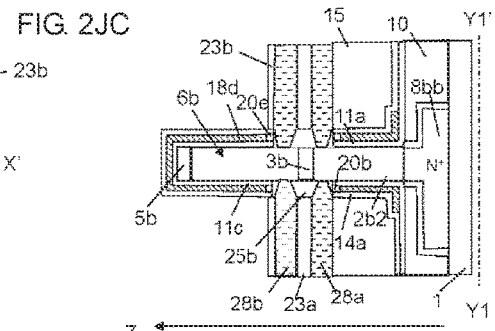
Figure 2J:
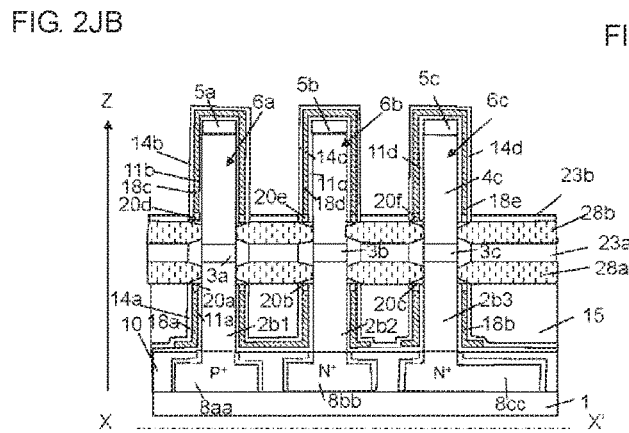
Figure 2J:
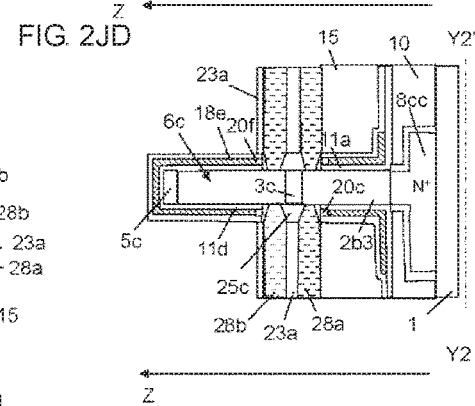

Subsequently, as illustrated in FIGS. 2JA to 2JD, for example, a heat treatment at 550° C. is carried out, so that Ni atoms in the Ni layers 21a and 21b are diffused into the P-type poly-Si layers 22a and 22b and the $N^+$-type poly-Si layers 26a and 26b, to thereby form nickel silicide (NiSi) layers 28a and 28b. The NiSi layers 28a and 28b have volumes expanded from the volumes of the P-type poly-Si layers 22a and 22b and the $N^+$-type poly-Si layers 26a and 26b (regarding this expansion in the volumes, refer to T. Morimoto, T. Ohguro, H. Sasaki, M. S. Momose, T. Iinuma, I. Kunishima, K. Suguro, I. Katakabe, H. Nakajima, M. Tsuchiaki, M. Ono, Y. Katsumata, and H. Iwai: "Self-Aligned Nickel-Mono-Silicide Technology for High-Speed Deep Submicrometer Logic CMOS ULSI" IEEE Transaction on Electron Devices, Vol. 42, No. 5, pp. 915-922 (1995)). Since the P-type poly-Si layers 22a and 22b and the $N^+$-type poly-Si layers 26a and 26b are held between the SiN layer 15 and the $SiO_2$ layers 23a and 23b, the NiSi layers 28a and 28b mainly protrude into the spaces 25a, 25b, and 25c. The As atoms contained in the $N^+$-type poly-Si layers 26a and 26b and the B atoms contained in the P-type poly-Si layers 22a and 22b are pushed outward in the NiSi layers 28a and 28b (regarding this push-out phenomenon, refer to T. Morimoto, T. Ohguro, H. Sasaki, M. S. Momose, T. Iinuma, I. Kunishima, K. Suguro, I. Katakabe, H. Nakajima, M. Tsuchiaki, M. Ono, Y. Katsumata, and H. Iwai: "Self-Aligned Nickel-Mono-Silicide Technology for High-Speed Deep Submicrometer Logic CMOS ULSI" IEEE Transaction on Electron Devices, Vol. 42, No. 5, pp. 915-922 (1995)). As a result of this impurity-atom push-out effect, protrusions (not shown) having high contents of impurity atoms are formed in the surface layers of the sides of the NiSi layers 28a and 28b, which protrude into the spaces 25a, 25b, and 25c. The side surfaces of the protrusions are in contact with the surfaces of the Si pillars 6a, 6b, and 6c.

Figure 2K:
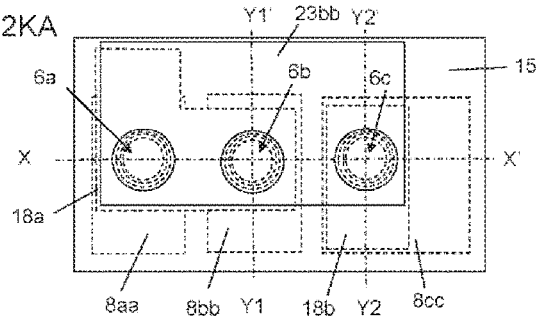
FIGS. 2KA to 2KD are a plan view and sectional structural views that illustrate a method for producing an SGT-including pillar-shaped semiconductor device according to a first embodiment.
Figure 2K:
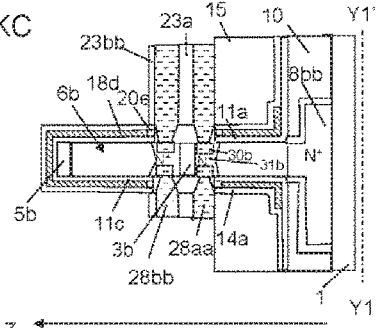
Figure 2K:
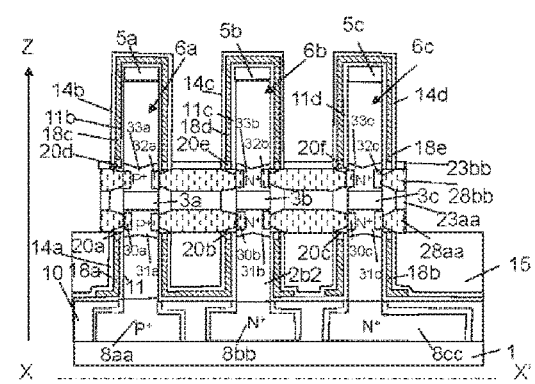
Figure 2K:
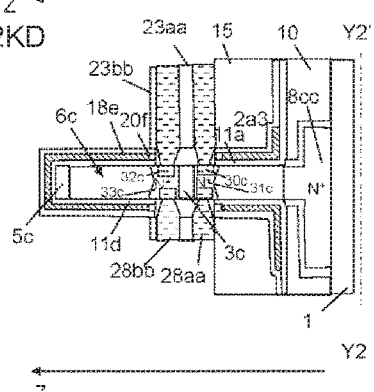

Subsequently, as illustrated in FIGS. 2KA to 2KD, a heat treatment is carried out to cause silicide expansion of the NiSi layers 28a and 28b, and to diffuse, by the impurity push-out effect, from the protrusions, As atoms and B atoms into the Si pillars 6a, 6b, and 6c. As a result, NiSi layers 30a, 30b, and 30c are respectively formed in the surface layers of the sides of the Si pillars 6a, 6b, and 6c in contact with the NiSi layer 28a; and B atoms and As atoms are diffused, by the impurity push-out effect, into the Si pillars 6a, 6b, and 6c, to thereby form a $P^+$ layer 31a and $N^+$ layers 31b and 31c respectively within the Si pillars 6a, 6b, and 6c. Similarly, NiSi layers 32a, 32b, and 32c are respectively formed in the surface layers of the sides of the Si pillars 6a, 6b, and 6c in contact with the NiSi layer 28b; and B atoms and As atoms are diffused, by the impurity push-out effect, into the Si pillars 6a, 6b, and 6c, to thereby respectively form a $P^+$ layer 33a and N⁺ layers 33b and 33c within the Si pillars 6a, 6b, and 6c. In the SiO₂ layers 3a, 3b, and 3c, thermal diffusion of donor and acceptor impurity atoms is suppressed and simultaneously formation of silicide is suppressed. As a result, the P⁺ layer 31a and the N⁺ layers 31b and 31c are isolated from the P⁺ layer 33a and the N⁺ layers 33b and 33c by the SiO₂ layers 3a, 3b, and 3c. Subsequently, a lithographic process and an RIE process are carried out to pattern the NiSi layers 28a and 28b and the SiO₂ layers 23a and 23b so as to remain in the outer peripheral portions around the Si pillars 6a, 6b, and 6c. As a result, NiSi layers 28aa and 28bb and SiO₂ layers 23aa and 23bb are formed.

Figure 2L:
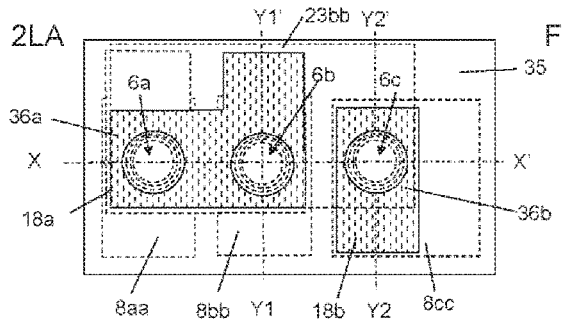
FIGS. 2LA to 2LD are a plan view and sectional structural views that illustrate a method for producing an SGT-including pillar-shaped semiconductor device according to a first embodiment.
Figure 2L:
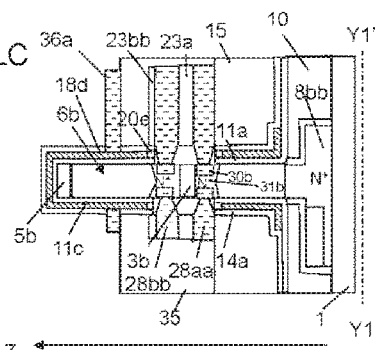
Figure 2L:
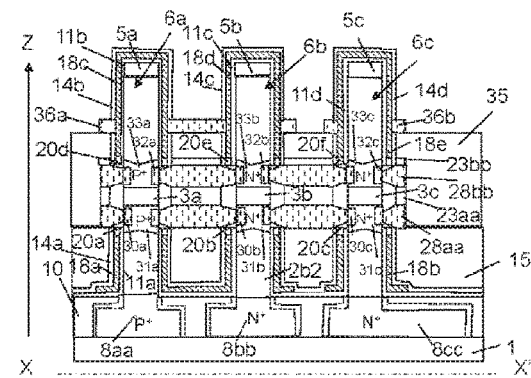
Figure 2L:
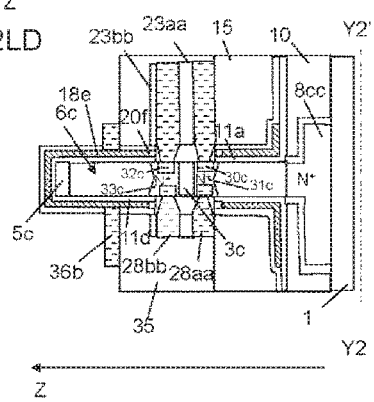

Subsequently, as illustrated in FIGS. 2LA to 2LD, the same process as in the formation of the SiN layer 15 is carried out to form a SiN layer 35 such that its upper surface is positioned in the middle of (in the height direction of) the TiN layers 18c, 18d, and 18e. Subsequently, the same process as in the formation of the spaces 25a, 25b, and 25c is carried out to form openings in the outer peripheries of the TiN layers 18c, 18d, and 18e. Subsequently, a NiSi layer 36a in contact with the TiN layers 18c and 18d, and a NiSi layer 36b in contact with the TiN layer 18e are formed.

Figure 2M:
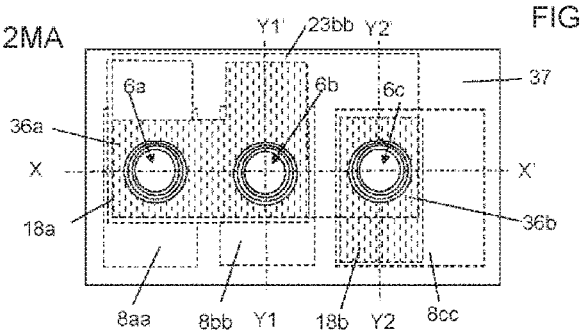
FIGS. 2MA to 2MD are a plan view and sectional structural views that illustrate a method for producing an SGT-including pillar-shaped semiconductor device according to a first embodiment.
Figure 2M:
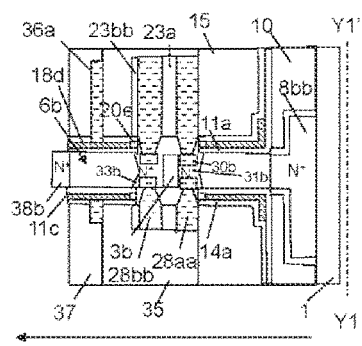
Figure 2M:
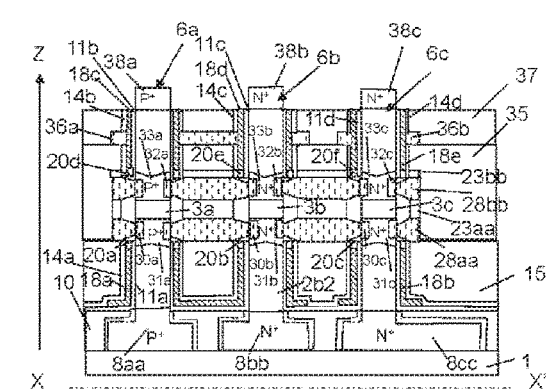
Figure 2M:
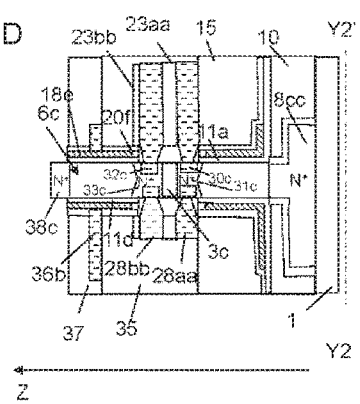

Subsequently, as illustrated in FIGS. 2MA to 2MD, a SiO₂ layer 37 is formed such that its upper surface is positioned higher than the surfaces of the NiSi layers 36a and 36b and lower than the top portions of the Si pillars 6a, 6b, and 6c. Subsequently, the SiO₂ layers 14b, 14c, and 14d, the TiN layers 18c, 18d, and 18e, and the HfO₂ layers 11b, 11c, and 11d in the top portions of the Si pillars 6a, 6b, and 6c are etched off through the SiO₂ layer 37 serving as a mask. Subsequently, a lithographic process and an ion implantation process are carried out with the SiO₂ layers 37, 14b, 14c, and 14d, the TiN layers 18c, 18d, and 18e, and the HfO₂ layers 11b, 11c, and 11d serving as masks, such that boron (B) is ion-implanted into the top portion of the Si pillar 6a to form a P⁺ layer 38a, and arsenic (As) is ion-implanted into the top portions of the Si pillars 6b and 6c to form N⁺ layers 38b and 38c.

Figure 2N:
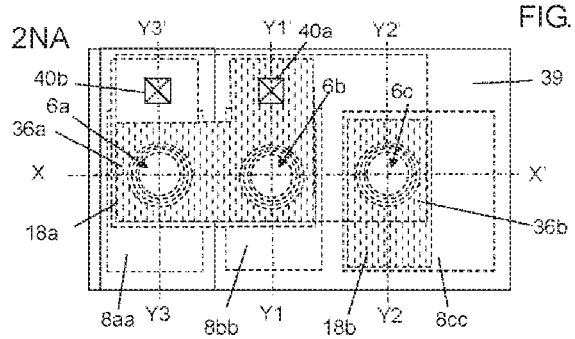
FIGS. 2NA to 2NE are a plan view and sectional structural views that illustrate a method for producing an SGT-including pillar-shaped semiconductor device according to a first embodiment.
Figure 2N:
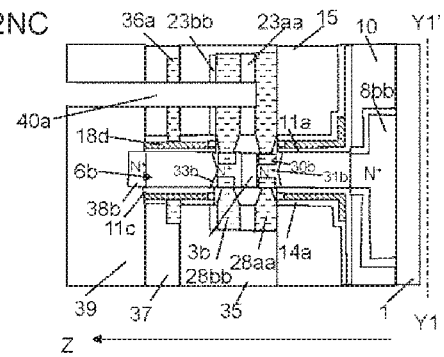
Figure 2N:
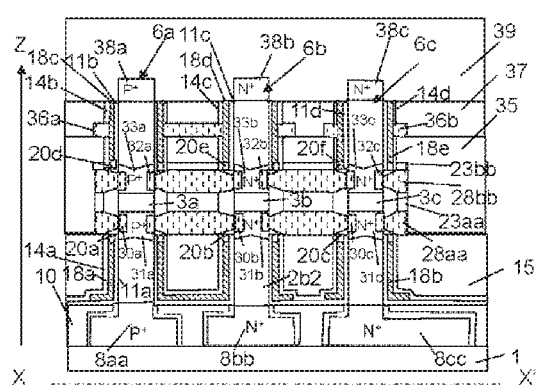
Figure 2N:
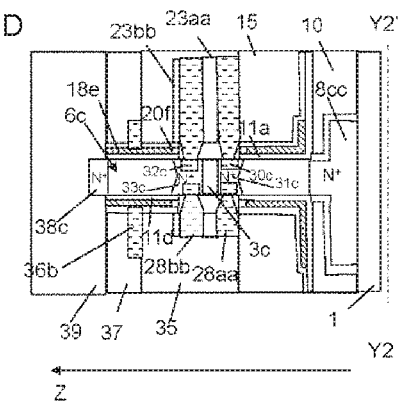
Figure 2N:
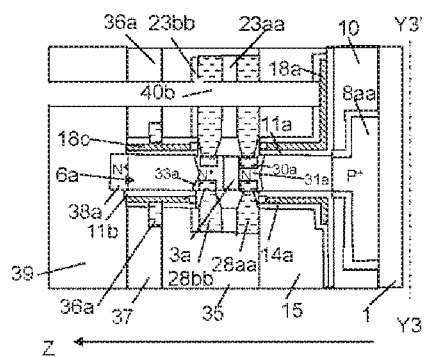

FIGS. 2NA to 2NE illustrate the following steps. Among FIG. 2NE to FIG. 2XE, figures suffixed with E are sectional structural views taken along lines Y3-Y3' in the corresponding figures suffixed with A. A SiO₂ layer 39 is formed so as to have a flat surface over the whole structure by a CVD process and a MCP process. Subsequently, a lithographic process and an RIE process are carried out to form a contact hole 40a, which extends through the SiO₂ layers 39 and 37, the NiSi layer 36a, the SiN layer 35, the SiO₂ layer 23bb, the NiSi layer 28bb, and the SiO₂ layer 23aa to the NiSi layer 28aa. Similarly, a lithographic process and an RIE process are carried out to form a contact hole 40b, which extends through the SiO₂ layers 39 and 37, the SiN layer 35, the SiO₂ layer 23bb, the NiSi layer 28bb, the SiO₂ layer 23aa, the SiN layer 15, and the SiO₂ layer 14a to the TiN layer 18a. In this case, the whole outer periphery of the contact hole 40a is not necessarily positioned within the NiSi layers 28aa, 23bb, and 36a. Portions of the outer periphery of the contact hole 40a may connect to the NiSi layers 28aa, 23bb, and 36a. Similarly, the whole outer periphery of the contact hole 40b is not necessarily positioned within the NiSi layers 28aa and 23bb and the TiN layer 18a. Portions of the outer periphery of the contact hole 40b may connect to the NiSi layers 28aa and 23bb and the TiN layer 18a.

Figure 2O:
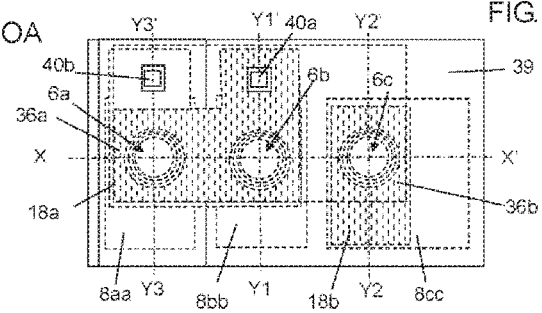
FIGS. 2OA to 2OE are a plan view and sectional structural views that illustrate a method for producing an SGT-including pillar-shaped semiconductor device according to a first embodiment.
Figure 2O:
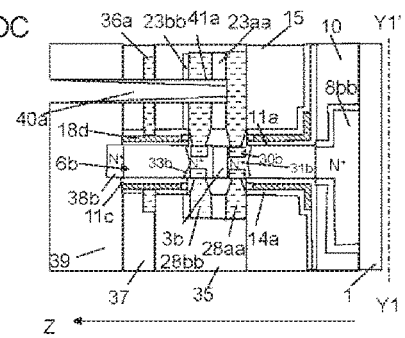
Figure 2O:
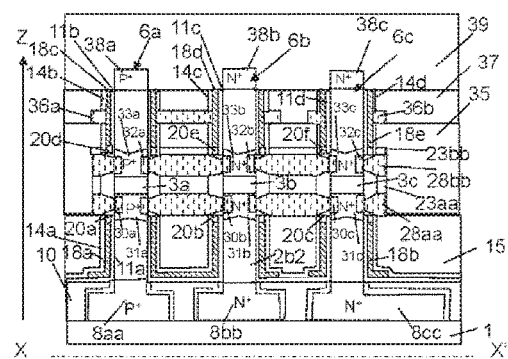
Figure 2O:
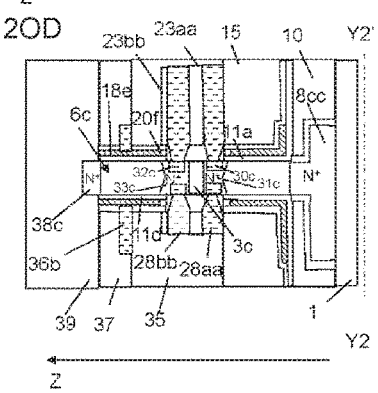
Figure 2O:
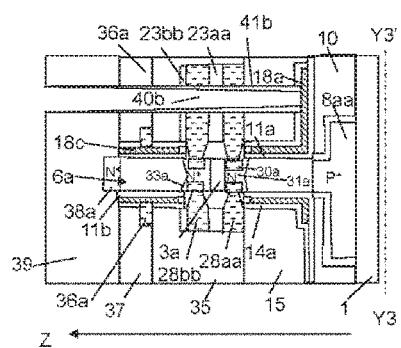

Subsequently, as illustrated in FIGS. 2OA to 2OE, a SiO₂ layer (not shown) is deposited over the whole structure by an ALD process. Subsequently, an RIE process is carried out to remove the SiO₂ layer on the NiSi layer 28aa while a SiO₂ layer 41a is left on the side surface of the contact hole 40a.

Similarly, the SiO₂ layer on the TiN layer 18a is removed while a SiO₂ layer 41b is left on the side surface of the contact hole 40b.

Figure 2P:
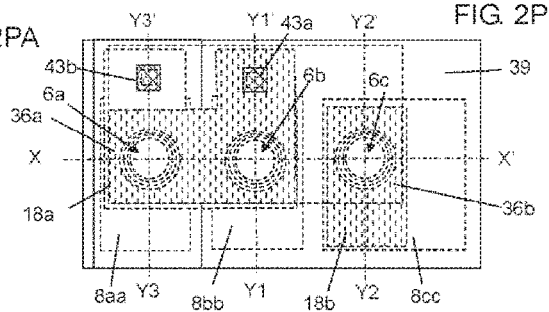
FIGS. 2PA to 2PE are a plan view and sectional structural views that illustrate a method for producing an SGT-including pillar-shaped semiconductor device according to a first embodiment.
Figure 2P:
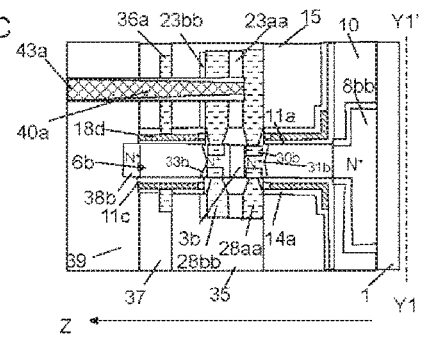
Figure 2P:
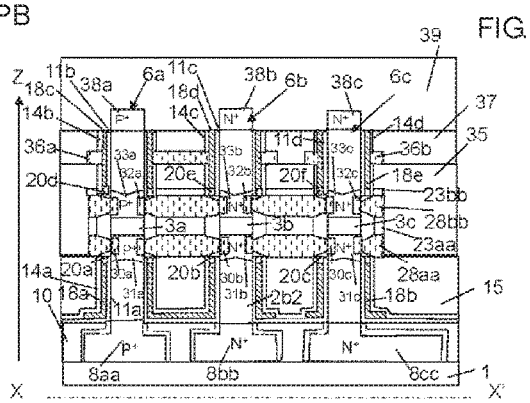
Figure 2P:
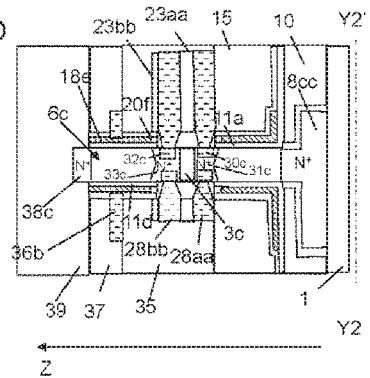
Figure 2P:
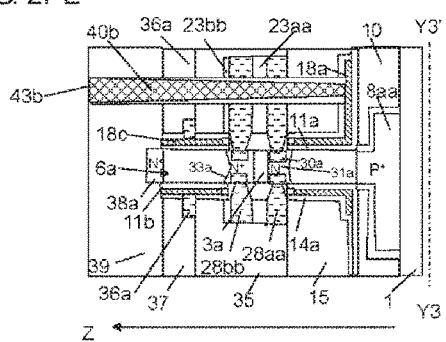

Subsequently, as illustrated in FIGS. 2PA to 2PE, an ALD process is carried out over the whole structure to deposit a tungsten (W) layer (not shown) into the contact holes 40a and 40b and on the SiO₂ layer 39. Subsequently, a MCP process is carried out to polish the surface layers of the W layer and the SiO₂ layer 39, to thereby form W layers 43a and 43b such that the level of their upper surfaces matches with the level of the upper surface of the SiO₂ layer 39.

Subsequently, as illustrated in FIGS. 2QA to 2QE, an RIE process is carried out to isotropically etch the SiO₂ layer 39. As a result of this etching, the upper surface of the SiO₂ layer 39 is positioned above the P⁺ layer 38a and N⁺ layers 38b and 38c; and the top portions of the W layers 43a and 43b protrude from the upper surface of the SiO₂ layer 39. Subsequently, a CVD process is carried out to deposit a SiO₂ layer (not shown) over the whole structure. Subsequently, a CMP process and an RIE process are carried out to remove the SiO₂ layer over the SiO₂ layer 39 while SiO₂ layers 46a and 46b are left on the side surfaces of the W layers 43a and 43b.

Subsequently, as illustrated in FIGS. 2RA to 2RE, a CVD process is carried out to deposit, for example, an aluminum oxide (AlO) insulating layer (not shown) over the whole structure. Subsequently, a CMP process of planarization polishing is carried out such that the level of the upper surface of the AlO layer matches with the level of the upper surfaces of the W layers 43a and 43b. Thus, an AlO layer 51 is formed. Subsequently, the SiO₂ layers 46a and 46b on the side surfaces of the W layers are removed.

Subsequently, as illustrated in FIGS. 2SA to 2SE, an RIE process is carried out to etch, through the AlO layer 51 serving as a mask, the SiO₂ layers 39 and 37 on the outer periphery of the W layer 43a and the SiO₂ layer 41a, which is in contact with these layers. Thus, a contact hole 52a is formed so as to extend to the NiSi layer 36a. Similarly, etching is carried out, through the AlO layer 51 serving as a mask, on the SiO₂ layers 39 and 37, the SiN layer 35, and the SiO₂ layer 23bb on the outer periphery of the W layer 43b and the SiO₂ layer 41b, which is in contact with these layers. Thus, a contact hole 52b is formed so as to extend to the NiSi layer 28bb.

Subsequently, as illustrated in FIGS. 2TA to 2TE, an ALD process is carried out to deposit a W layer (not shown) into the contact holes 52a and 52b and on the AlO layer 51. Subsequently, a CMP process is carried out to polish the W layer and the AlO layer 51, to thereby form W layers 43aa and 54aa such that the level of their upper surfaces matches with the level of the upper surface of the SiO₂ layer 39. Similarly, W layers 43bb and 54bb are formed such that the level of their upper surfaces matches with the level of the upper surface of the SiO₂ layer 39.

Subsequently, as illustrated in FIGS. 2UA to 2UE, a wiring metal layer 55a, which connects to the W layers 43aa and 54aa, is formed on the SiO₂ layer 39. Similarly, a wiring metal layer 55b, which connects to the W layers 43bb and 54bb, is formed on the SiO₂ layer 39.

Figure 2V:
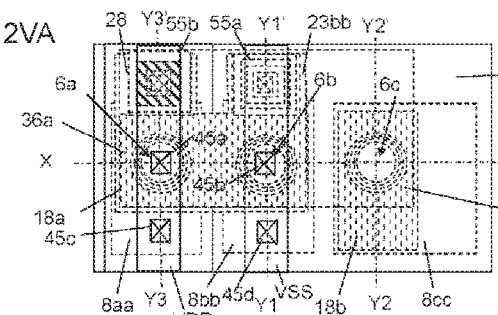
FIGS. 2VA to 2VE are a plan view and sectional structural views that illustrate a method for producing an SGT-including pillar-shaped semiconductor device according to a first embodiment.
Figure 2V:
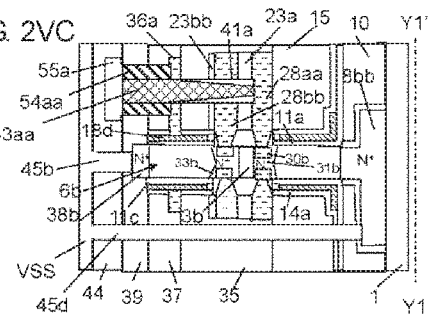
Figure 2V:
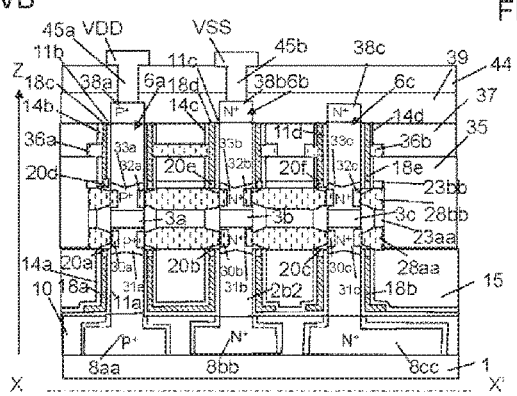
Figure 2V:
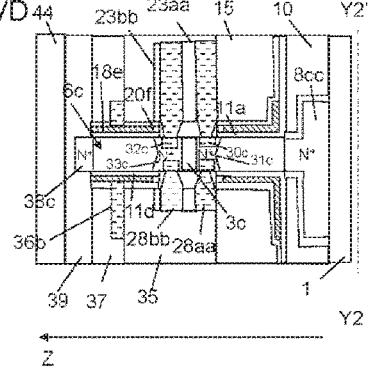
Figure 2V:
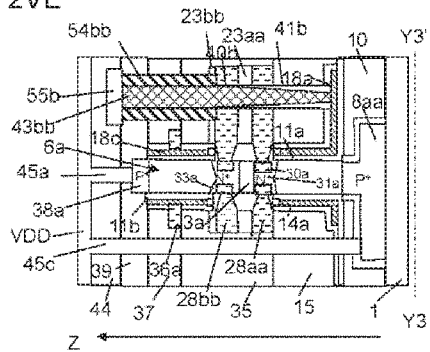

Subsequently, as illustrated in FIGS. 2VA to 2VE, a CVD process and a CMP process are carried out to form a SiO₂ layer 44 over the whole structure. Subsequently, a contact hole 45a is formed so as to extend through the SiO₂ layers 44 and 39 and the like to the P⁺ layer 38a, which is in the top portion of the Si pillar 6a; a contact hole 45b is formed so as to extend to the N⁺ layer 38b, which is in the top portion of the Si pillar 6b; a contact hole 45c is formed so as to extend to the P⁺ layer 8aa; and a contact hole 45d is formed so as to extend to the N⁺ layer 8bb. Subsequently, a power supply wiring metal layer VDD is formed so as to connect to the P⁺ layers 38a and 8aa via the contact holes 45a and 45c and so as to extend along line Y3-Y3' in plan view. In addition, a ground wiring metal layer VSS is formed so as to connect to the N⁺ layers 38b and 8bb via the contact holes 45b and 45d and so as to extend along line Y1-Y1' in plan view.

Figure 2W:
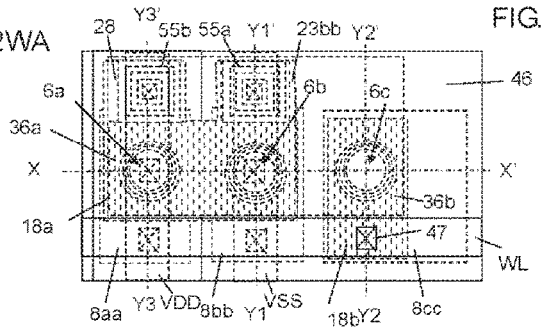
FIGS. 2WA to 2WE are a plan view and sectional structural views that illustrate a method for producing an SGT-including pillar-shaped semiconductor device according to a first embodiment.
Figure 2W:
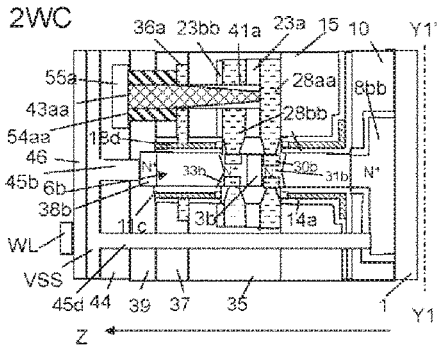
Figure 2W:
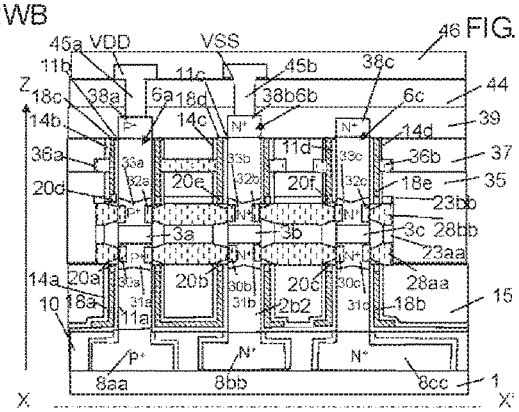
Figure 2W:
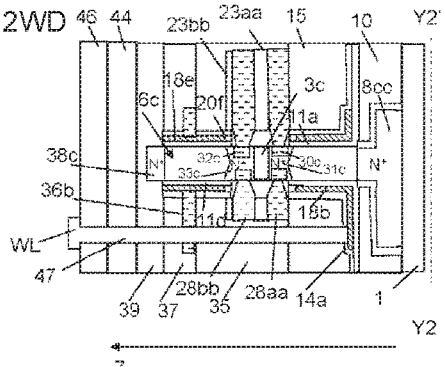
Figure 2W:
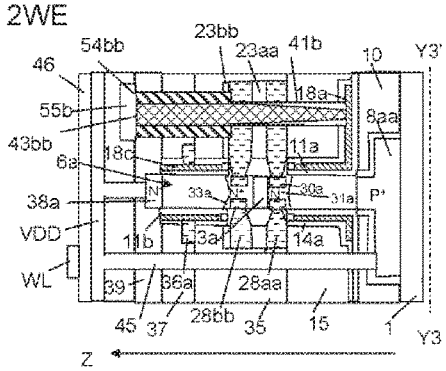

Subsequently, as illustrated in FIGS. 2WA to 2WE, a CVD process and a CMP process are carried out to form a SiO₂ layer 46 over the whole structure. Subsequently, a contact hole 47 is formed so as to extend through the SiO₂ layers 46, 44, 39, and 37, the NiSi layer 36b, the SiN layers 35 and 15, and the SiO₂ layer 14a to the TiN layer 18b. Subsequently, a word line wiring metal layer WL is formed so as to connect the TiN layer 18b and the NiSi layer 36b to each other via the contact hole 47 and so as to extend along line X-X'.

Subsequently, as illustrated in FIGS. 2XA to 2XE, a CVD process and a CMP process are carried out to form a SiO₂ layer 48 over the whole structure. Subsequently, a contact hole 49a is formed so as to extend through the SiO₂ layers 48, 46, 44, and 39 to the N⁺ layer 38c, which is in the top portion of the Si pillar 6c; and a contact hole 49b is formed so as to extend through the SiO₂ layers 48, 46, 44, 39, and 37, the SiN layers 35 and 15, the SiO₂ layer 14a, the HfO₂ layer 11a, and the SiO₂ layers 10 and 7c to the N⁺ layer 8cc. Subsequently, a bit line wiring metal layer BL is formed so as to connect via the contact hole 49a to the N⁺ layer 38c and so as to extend along line Y2-Y2' in plan view; and an inverted bit line wiring metal layer BLR is formed so as to connect via the contact hole 49b to the N⁺ layer 8cc and so as to extend along the bit line wiring metal layer BL in plan view.

As illustrated in FIGS. 2XA to 2XE, in an upper portion of the Si pillar 6a, an SGT (corresponding to the P-channel SGT Pc1 in FIG. 1B) is formed that includes the P⁺ layers 33a and 38a as the drain and the source, includes the TiN layer 18c as the gate, and includes, as the channel, a region between the P⁺ layers 33a and 38a in the Si pillar 6a; and, in a lower portion of the Si pillar 6a, an SGT (corresponding to the P-channel SGT Pc2 in FIG. 1B) is formed that includes the P⁺ layers 8aa and 31a as the source and the drain, includes the TiN layer 18a as the gate, and includes, as the channel, a region between the P⁺ layers 8aa and 31a in the Si pillar 6a.

In addition, in an upper portion of the Si pillar 6b, an SGT (corresponding to the N-channel SGT Nc1 in FIG. 1B) is formed that includes the N⁺ layers 38b and 33b as the source and the drain, includes the TiN layer 18d as the gate, and includes, as the channel, a region between the N⁺ layers 38b and 33b in the Si pillar 6b; and, in a lower portion of the Si pillar 6b, an SGT (corresponding to the N-channel SGT Nc2 in FIG. 1B) is formed that includes the N⁺ layers 8bb and 31b as the source and the drain, includes the TiN layer 18a as the gate, and includes, as the channel, a region between the N⁺ layers 8bb and 31b in the Si pillar 6a.

In addition, in an upper portion of the Si pillar 6c, an SGT (corresponding to the N-channel SGT SN1 in FIG. 1B) is formed that includes the N⁺ layers 38c and 33c as the source and the drain, includes the TiN layer 18e as the gate, and includes, as the channel, a region between the N⁺ layers 38c and 33c in the Si pillar 6c; and, in a lower portion of the Si pillar 6c, an SGT (corresponding to the N-channel SGT Nc2 in FIG. 1B) is formed that includes the N⁺ layers 8cc and 31c as the source and the drain, includes the TiN layer 18b as the gate, and includes, as the channel, a region between the N⁺ layers 8cc and 31c in the Si pillar 6c.

These SGTs (corresponding to the SGTs Pc1, Pc2, Nc1, Nc2, SN1, and SN2 in FIG. 1B) are connected together via wires to thereby provide an SRAM cell circuit constituted by, as in the schematic structural view in FIG. 1B, a circuit area (corresponding to the circuit area C1 in FIG. 1B) including, in upper portions of the Si pillars 6a, 6b, and 6c, a P-channel SGT (corresponding to the P-channel SGT Pc1 in FIG. 1B) and N-channel SGTs (corresponding to the N-channel SGTs Nc1 and SN1 in FIG. 1B), and a circuit area (corresponding to the circuit area C2 in FIG. 1B) including, in lower portions of the Si pillars 6a, 6b, and 6c, a P-channel SGT (corresponding to the P-channel SGT Pc2 in FIG. 1B) and N-channel SGTs (corresponding to the N-channel SGTs Nc2 and SN2 in FIG. 1B).

The production method according to the first embodiment provides the following advantages.

1. The SiO₂ layer 41a is formed on a side surface (facing the W layer 43aa) of the NiSi layer 28bb. As a result, although the NiSi layers 28aa, 28bb, and 36a overlap in plan view, while insulation between the W layer 43aa extending through these layers and the NiSi layer 28bb is achieved, the W layer 43aa enables connection between the NiSi layer 28aa and the NiSi layer 36a. This enables a reduction in the area of the SRAM cell.

Similarly, the SiO₂ layer 41c is formed on a side surface (facing the W layer 43bb) of the NiSi layer 28aa. As a result, although the TiN layer 18a and the NiSi layers 28aa and 28bb overlap in plan view, while insulation between the W layer 43bb extending through these layers and the NiSi layer 28aa is achieved, the W layer 43bb enables connection between the TiN layer 18a and the NiSi layer 28bb. This enables a reduction in the area of the SRAM cell.

2. In the structure including layers overlapping in plan view that are the NiSi layer 28aa as a lower wiring conductor layer, the NiSi layer 28bb as an intermediate wiring conductor layer, and the NiSi layer 36a as an upper wiring conductor layer, the W layer 43aa is formed so as to extend through the NiSi layers 28bb and 36a to the NiSi layer 28aa, and have a top portion positioned above the NiSi layer 36a. The W layer 54aa, which is formed so as to surround the outer periphery of the W layer 43aa in a self-aligned manner without a special lithographic process, is connected to the upper surface of the NiSi layer 36a. Thus, connections between the wiring metal layer 55a and the NiSi layers 36a and 28aa are established.

3. In this embodiment, the P⁺ layer 8aa and the N⁺ layers 8bb and 8cc of the lower SGTs each have a structure in which the source/drain impurity region of the SGT and a wiring conductor layer are integrated. In this case, the wiring conductor layer is formed of single-crystal Si containing donor or acceptor impurity. Thus, the wiring conductor layer may be formed of a single-crystal layer containing donor or acceptor impurity. Similarly, for the P⁺ layers 31a, 32a, 33a, and 38a and the N⁺ layers 31b, 31c, 32b, 32c, 33b, 33c, 38b, and 38c, which are formed in intermediate portions and top portions of the Si pillars 6a, 6b, and 6c, single-crystal layers containing donor or acceptor impurity may be used for wiring conductor layers. In this case, single-crystal semiconductor layers formed of, for example, Si or SiGe and containing acceptor or donor impurity may be formed by, for example, a selective epitaxial crystal growth method so as to be in contact with the Si pillars 6a, 6b, and 6c. Incidentally, when such a wiring conductor layer that is a single-crystal layer containing donor or acceptor impurity is used, a first wiring conductor layer that is this single-crystal layer may be formed to connect to a second wiring conductor layer formed of metal or alloy, to form a wiring conductor layer that is the combination of the first wiring conductor layer and the second wiring conductor layer. When the single-crystal layers containing donor or acceptor impurity are used as wiring conductor layers, the single-crystal layers containing donor or acceptor impurity themselves serve as sources or drains without formation of, within the Si pillars 6a, 6b, and 6c, the P$^+$ layers 31a, 32a, 33a, and 38a and the N$^+$ layers 31b, 31c, 32b, 32c, 33b, 33c, 38b, and 38c. In this way, as wiring conductor layers, single-crystal semiconductor layers containing donor or acceptor impurity may be used to thereby increase the density of an SGT-including circuit.

Similarly, in the structure including layers overlapping in plan view that are the TiN layer 18a as a lower wiring conductor layer, the NiSi layer 28aa as an intermediate wiring conductor layer, and the NiSi layer 28bb as an upper wiring conductor layer, the W layer 43bb is formed so as to extend through the NiSi layers 28aa and 28bb to the TiN layer 18a, and have a top portion positioned above the NiSi layer 28bb. The W layer 54bb, which is formed so as to surround the outer periphery of the W layer 43bb in a self-aligned manner without a special lithographic process, is connected to the upper surface of the NiSi layer 36a. Thus, connections between the wiring metal layer 55b, the NiSi layer 28bb, and the TiN layer 18a are established.

In this way, the W layer 43aa and the W layer 54aa are formed in a self-aligned manner, and the W layer 43bb and the W layer 54bb are formed in a self-aligned manner. This enables a high-density wiring of the SRAM cell.

In summary, the SRAM cell circuit area according to this embodiment includes, in plan view, three Si pillars 6a, 6b, and 6c, and nine contact holes 40a (in which the W layer 43aa is buried), 40b (in which the W layer 43bb is buried), 45a, 45b, 45c, 45d, 47, 49a, and 49b. In general, when a single SGT is formed per semiconductor pillar, it is necessary to form at least three contacts (connections via contact holes) from the source, the drain, and the gate to wiring metal layers. By contrast, in this embodiment, although two SGTs are formed per semiconductor pillar (Si pillar), the SRAM cell circuit is provided with three contacts per semiconductor pillar. This enables a high-density SGT-including SRAM cell circuit. Therefore, in a circuit including pillar-shaped semiconductors such as SGTs, when wiring conductor layers connecting to nodes such as the source, the drain, and the gate are formed so as to overlap in plan view and a wiring conductor layer that needs to be insulated is present between wiring conductor layers that are connected to each other, the connection between wiring conductor layers according to this embodiment enables an increase in the density of the circuit.

Second Embodiment

Figure 3A:
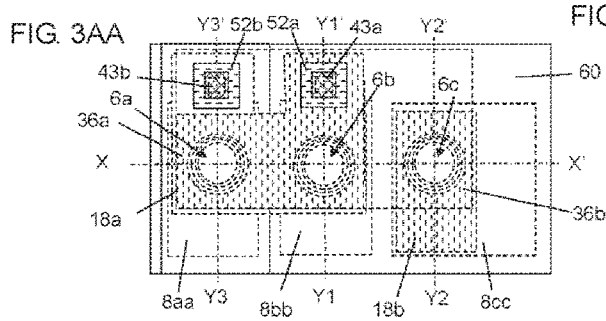
FIGS. 3AA to 3AE are a plan view and sectional structural views that illustrate a method for producing an SGT-including pillar-shaped semiconductor device according to a second embodiment of the present invention.
Figure 3A:
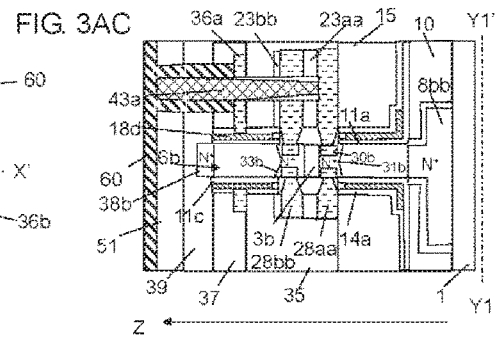
Figure 3A:
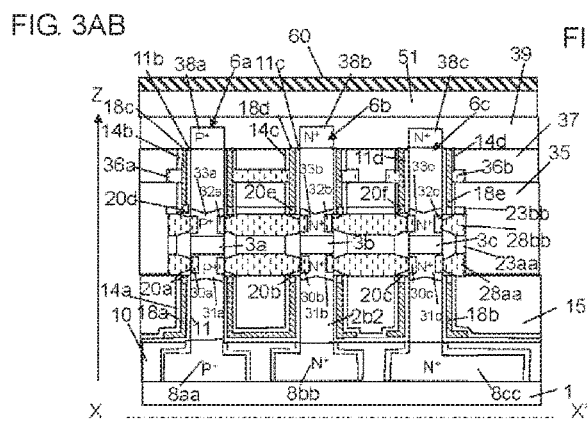
Figure 3A:
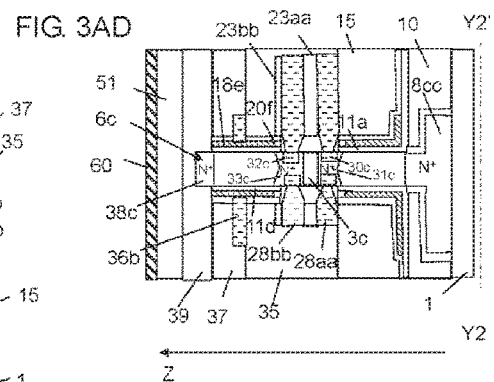
Figure 3A:
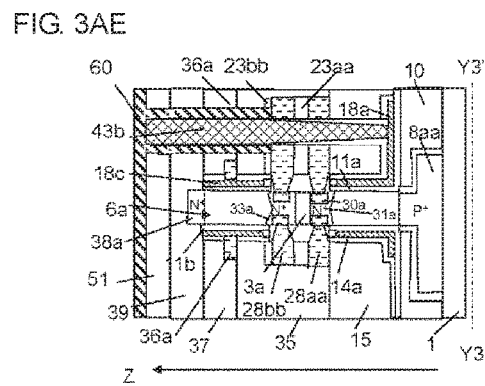

Hereinafter, with reference to FIG. 3AA to FIG. 3BE, a method for producing an SGT-including pillar-shaped semiconductor device according to a second embodiment of the present invention will be described. Among FIG. 3AA to FIG. 3BE, figures suffixed with A are plan views; figures suffixed with B are sectional structural views taken along lines X-X' in the corresponding figures suffixed with A; figures suffixed with C are sectional structural views taken along lines Y1-Y1 ' in the corresponding figures suffixed with A; figures suffixed with D are sectional structural views taken along lines Y2-Y2' in the corresponding figures suffixed with A; and figures suffixed with E are sectional structural views taken along lines Y3-Y3' in the corresponding figures suffixed with A. The production method according to the second embodiment is the same as in the steps according to the first embodiment in FIGS. 2AA to 2XE except for the following differences.

The same steps as in FIG. 2AA to FIG. 2SE are carried out. Subsequently, as illustrated in FIGS. 3AA to 3AE, an ALD process is carried out to deposit a W layer (not shown) into the contact holes 52a and 52b and on the AlO layer 51. Subsequently, the W layer is polished by a CMP process so as to be left on the AlO layer 51. Thus, a W layer 60 is formed.

Figure 3B:
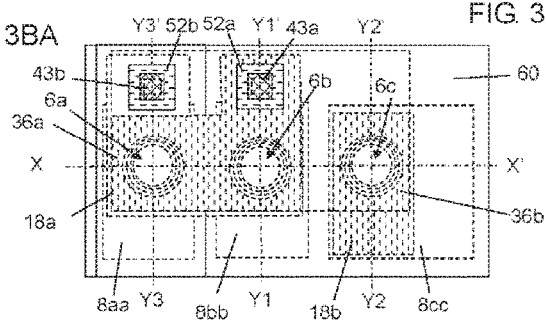
FIGS. 3BA to 3BE are a plan view and sectional structural views that illustrate a method for producing an SGT-including pillar-shaped semiconductor device according to a second embodiment.
Figure 3B:
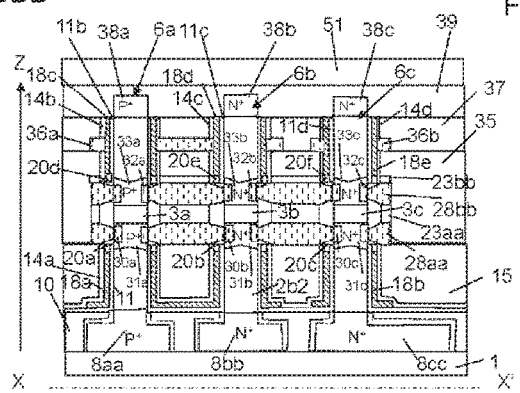
Figure 3B:
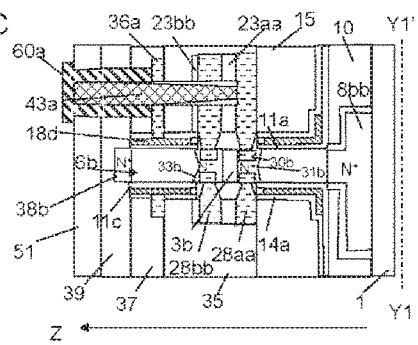
Figure 3B:
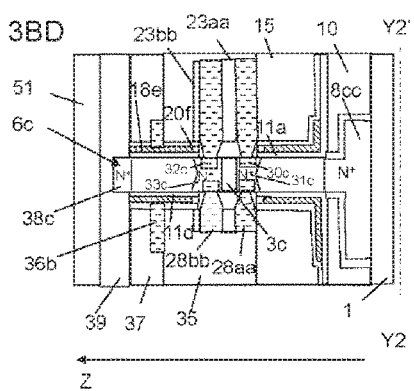
Figure 3B:
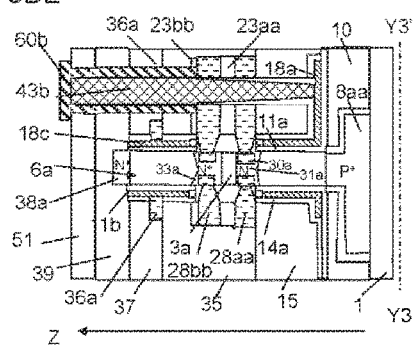

Subsequently, as illustrated in FIGS. 3BA to 3BE, a lithographic process and an RIE process are carried out to form a W layer 60a, which connects to the outer periphery of the top portion of the W layer 43a, and has the same shape as the wiring metal layer 55a in FIGS. 2UA and 2UC. Similarly, a W layer 60b is formed, which connects to the outer periphery of the top portion of the W layer 43b, and has the same shape as the wiring metal layer 55b in FIGS. 2UA and 2UE. Subsequently, the same steps as in FIG. 2VA to FIG. 2XE are carried out to thereby provide the same SRAM cell as in the first embodiment.

The production method for the SGT-including pillar-shaped semiconductor device according to the second embodiment provides the following advantages.

In the first embodiment, the W layer 54aa and the wiring metal layer 55a are separately formed. By contrast, in this embodiment, these layers are formed as a single layer that is the W layer 60a. As a result, the necessity of performing the metal layer deposition step for forming the wiring metal layer 55a has been eliminated, so that the steps are simplified, which is advantageous.

Third Embodiment

Hereinafter, with reference to FIG. 4AA to FIG. 4CE, a method for producing an SGT-including pillar-shaped semiconductor device according to a third embodiment of the present invention will be described. Among FIG. 4AA to FIG. 4CE, figures suffixed with A are plan views; figures suffixed with B are sectional structural views taken along lines X-X' in the corresponding figures suffixed with A; figures suffixed with C are sectional structural views taken along lines Y1-Y1' in the corresponding figures suffixed with A; figures suffixed with D are sectional structural views taken along lines Y2-Y2' in the corresponding figures suffixed with A; and figures suffixed with E are sectional structural views taken along lines Y3-Y3' in the corresponding figures suffixed with A. The production method according to the third embodiment is the same as in the steps according to the first embodiment in FIGS. 2AA to 2XE except for the following differences.

After the steps in FIG. 2AA to FIG. 2TE in the first embodiment are carried out, as illustrated in FIGS. 4AA to 4AE, contact holes 59a, 59b, and 59c are formed so as to extend to the Si pillars 6a, 6b, and 6c. Similarly, a contact hole 59d is formed so as to extend to the N$^+$ layer 8cc. Similarly, a contact hole 59e is formed so as to extend to the P$^+$ layer 8aa. Similarly, a contact hole 59f is formed so as to extend to the N$^+$ layer 8bb. Similarly, a contact hole 59g is formed so as to extend to the TiN layer 18a.

Figure 4B:
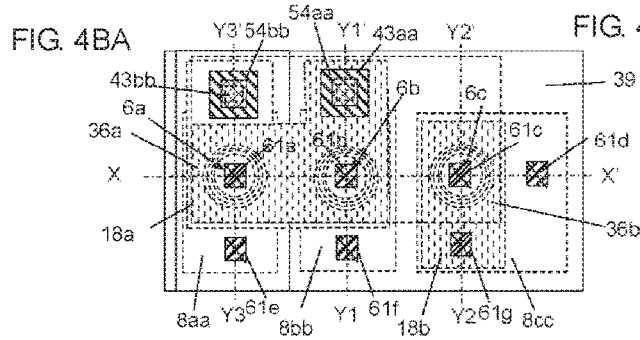
FIGS. 4BA to 4BE are a plan view and sectional structural views that illustrate a method for producing an SGT-including pillar-shaped semiconductor device according to a third embodiment.
Figure 4B:
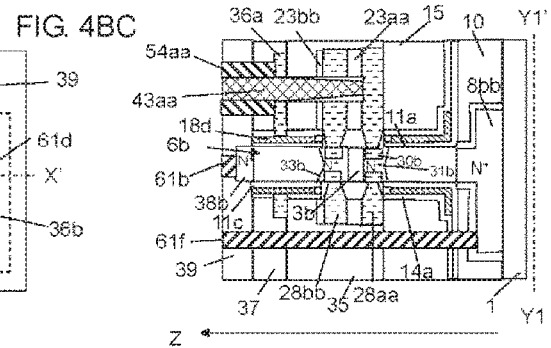
Figure 4B:
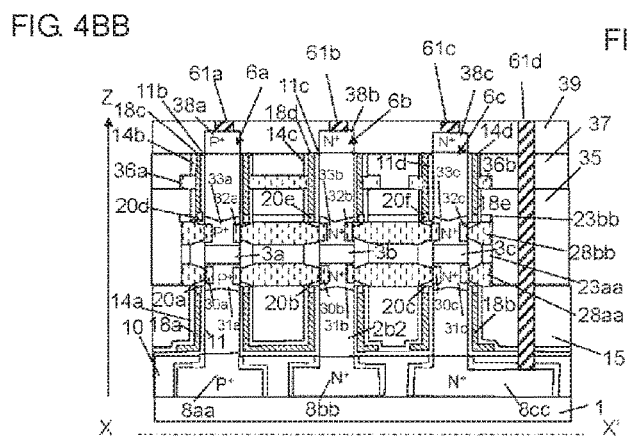
Figure 4B:
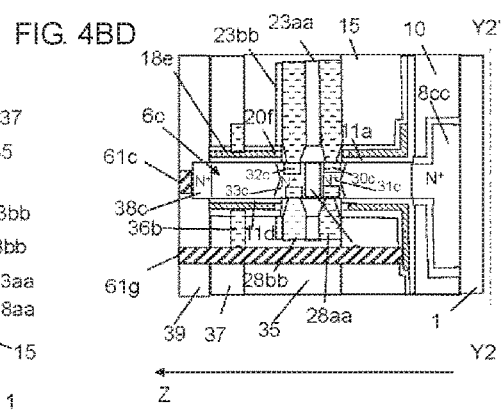
Figure 4B:
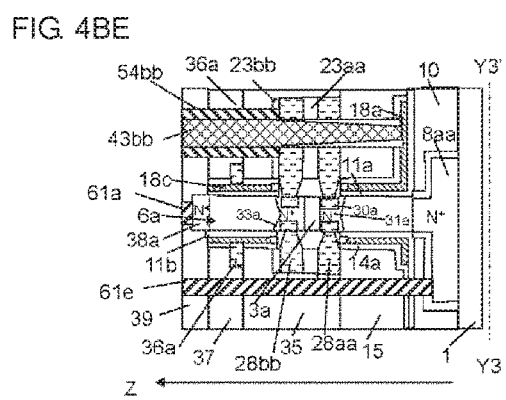
Figure 5:
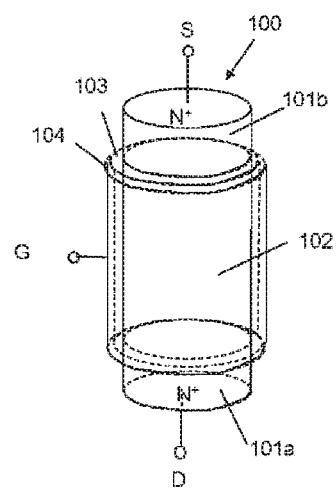
FIG. 5 is a schematic structural view of an existing SGT.

Subsequently, as illustrated in FIGS. 4BA to 4BE, a W layer (not shown) is deposited into the contact holes 59a, 59b, 59c, 59d, 59e, 59f, and 59g and over the whole structure. Subsequently, the whole structure is polished by a MCP process, to thereby form W layers 61a, 61b, 61c, 61d, 61e, 61f, and 61g in the contact holes 59a, 59b, 59c, 59d, 59e, 59f, and 59g. Thus, the surfaces of the top portions of the W layers 43aa, 43bb, 54aa, 54bb, 61a, 61b, 61c, 61d, 61e, 61f, and 61g are at the same level.

Subsequently, as illustrated in FIGS. 4CA to 4CE, the steps in FIG. 2UA to FIG. 2XE in the first embodiment are basically carried out except for the contact holes 59a, 59b, 59c, 59d, 59e, 59f, and 59g, to thereby form a power supply wiring metal layer VDD, which connects through the contact hole 45a to the W layer 61a; a ground wiring metal layer VSS, which connects through the contact hole 45b to the W layer 61b; a bit line wiring metal layer BL, which connects through the contact hole 49a to the W layer 61c; an inverted bit line wiring metal layer BLR, which connects through the contact hole 49b to the W layer 61d; a ground wiring metal layer VSS, which connects through the contact holes 45b and 45d to the W layers 61b and 61f; and a word line wiring metal layer WL, which connects through the contact hole 47 to the W layer 61g. As a result, the same SRAM cell as in the first embodiment is formed.

The production method for the SGT-including pillar-shaped semiconductor device according to the third embodiment provides the following advantages.

In the first embodiment, the bottoms of the contact holes 45a, 45b, 45c, 47, 49a, and 49b are at different levels. By contrast, in the third embodiment, the bottoms of the contact holes 45a, 45b, 45c, 47, 49a, and 49b are at the level of the surfaces of the top portions of the W layers 43aa, 43bb, 54aa, 54bb, 61a, 61b, 61c, 61d, 61e, 61f, and 61g. This facilitates formation of the wiring metal layers VDD, VSS, BL, BLR, and WL in the contact holes 45a, 45b, 45c, 47, 49a, and 49b. For example, as in CPU chips, when a logical circuit is formed on a chip having the SRAM cell region, the wiring metal layers formed are, in total, several tens of layers. For this reason, also in the formation of logical circuit portions, the contact holes connecting to the wiring metal layers can be formed such that the bottoms of the contact holes are at the same level, which leads to high-density formation of the wiring metal layers.

Incidentally, the first embodiment describes the SGT-including SRAM cell circuit as an example. However, the present invention is also applicable to formation of other SGT-including circuits. SGTs have a feature of providing a high-density structure in the formation of a circuit. Thus, for example, as described in the first embodiment, the following elements are formed so as to partially overlap in plan view: the power supply wiring metal layer VDD, the ground wiring metal layer VSS, the bit line wiring metal layer BL, and the inverted bit line wiring metal layer BLR, which are individually disposed in a horizontal direction and connect to some of the N$^+$ layers 31b, 31c, 32b, and 32c and the P$^+$ layers 31a and 32a within the Si pillars 6a, 6b, and 6c, and the N$^+$ layers 38b and 38c and the P$^+$ layer 38a in the top portions of the Si pillars 6a, 6b, and 6c; the NiSi layers 28aa, 28bb, 36a, and 36b, which are wiring conductor layers disposed in a horizontal direction and connect to the gate TiN layers 18c, 18d, and 18e surrounding the outer peripheries of the Si pillars 6a, 6b, and 6c; and the gate TiN layers 18a and 18b disposed in a horizontal direction. Such overlapping between wiring conductor layers in plan view similarly occurs in formation of other SGT-including circuits. Thus, the present invention provides the same advantages in formation of other SGT-including circuits. The same applies to other embodiments according to the present invention.

Incidentally, in the first embodiment, the source impurity regions in the bottom portions of the Si pillars 6a, 6b, and 6c and wiring conductor layer portions extending horizontally therefrom, which constitute the source P$^+$ layer 8aa and the N$^+$ layers 8bb and 8cc of the lower SGTs, are formed as the layers of the same material. Alternatively, for example, the wiring conductor layer portions may be formed of silicide or metal or other semiconductor layers formed of SiGe, for example, and containing donor or acceptor impurity at high concentration. Portions of wiring conductor layer portions may be formed of silicide or metal or semiconductor layers containing donor or acceptor impurity at high concentration; and, to these, other wiring material layers may be connected. The semiconductor layers containing donor or acceptor impurity at high concentration may connect to the side surfaces of the Si pillars and may be formed of single-crystal semiconductor layers. The same applies to other embodiments according to the present invention.

In the first embodiment, the contact holes 40a and 40c are formed in a region where, in plan view, the NiSi layer 28aa as a lower wiring conductor layer, the NiSi layer 28bb as an intermediate wiring conductor layer, and the NiSi layer 36a as an upper wiring conductor layer are formed so as to overlap. In this case, the NiSi layer 28aa connects to the drain N$^+$ layer 31b of a lower SGT; the NiSi layer 28bb is connected to the drain N$^+$ layer 32b of an upper SGT; and the NiSi layer 36a is connected to the gate TiN layer 18d of an upper SGT. Thus, depending on the design of an SGT-including circuit, the combination of the source impurity regions, the drain impurity regions, and the gate conductor layers of SGTs that connect to the upper wiring conductor layer, the intermediate wiring conductor layer, and the lower wiring conductor layer can be appropriately changed. Such changes applied in accordance with the circuit design include a configuration in which an upper wiring conductor layer, an intermediate wiring conductor layer, and a lower wiring conductor layer connect to the source impurity region, drain impurity region, and gate conductor layer of another Si pillar. The same applies to other embodiments according to the present invention.

In the first embodiment, in plan view, the contact holes 40a and 40c are formed such that the whole outer peripheries thereof overlap the NiSi layer 28aa serving as a lower wiring conductor layer, the NiSi layer 28bb serving as an intermediate wiring conductor layer, and the NiSi layer 36a serving as an upper wiring conductor layer. By contrast, another structure also provides the effect of an increase in the density of an SGT circuit: in the structure, in plan view, portions of the whole peripheries of the contact holes 40a and 40c overlap the NiSi layer 28aa serving as a lower wiring conductor layer, the NiSi layer 28bb serving as an intermediate wiring conductor layer, and the NiSi layer 36a serving as an upper wiring conductor layer.

In the first embodiment, the NiSi layer 28bb in which a side surface is insulated with the SiO$_2$ layer 41a has a side surface positioned, in plan view, at the outer periphery of the contact hole 40a. Alternatively, the NiSi layer 28bb may have a side surface extending outside of the contact hole 40a. This configuration enables a decrease in the capacitance between the NiSi layers 28aa and 28bb. Similarly, the NiSi layer 28aa in which a side surface is insulated with the SiO$_2$ layer 41b has a side surface positioned, in plan view, at the outer periphery of the contact hole 40b. Alternatively, the NiSi layer 28aa may have a side surface extending outside of the contact hole 40b. This configuration enables a decrease in the capacitance between the NiSi layer 28aa and the TiN layer 18a. This configuration is also effective in the formation of circuits other than SRAM cell circuits. The same applies to other embodiments according to the present invention.

The vertical NAND-type flash memory circuit includes plural memory cells stacked in the vertical direction, the memory cells each including a semiconductor pillar as the channel and including, around the semiconductor pillar, a tunnel oxide layer, a charge storage layer, an interlayer insulating layer, and a control conductor layer. Semiconductor pillars at both ends of these memory cells include a source line impurity layer corresponding to a source, and a bit line impurity layer corresponding to a drain. In addition, when one of memory cells on both sides of a memory cell functions as a source, the other functions as a drain. Thus, the vertical NAND-type flash memory circuit is one of SGT circuits. Therefore, the present invention is also applicable to NAND-type flash memory circuits.

In the first embodiment, the wiring metal layers 55a and 55b are formed on the W layers 43aa, 43bb, 54aa, and 54bb; however, formation of the wiring metal layers 55a and 55b may be omitted. The same applies to other embodiments according to the present invention.

In the first embodiment, the $SiO_2$ layers 46a and 46b are etched through the AlO layer 51 serving as an etching mask while the W layers 43a and 43b are left. However, as long as selective etching of forming the top portion of the lead-out wiring and an etching mask surrounding the top portion with a surrounding space therebetween can be performed, the materials of the lead-out wiring (a W layer is used in the first embodiment), the etching mask (an AlO layer is used in the first embodiment), and the layer to be removed (a $SiO_2$ layer is used in the first embodiment) and the etching method can be appropriately selected. In the first embodiment, in the subsequent step, in order to etch the $SiO_2$ layers 39 and 37 and the like, the AlO layer 51 is used as the etching mask; however, another material layer that serves as such an etching mask can be used. The same applies to other embodiments according to the present invention.

In the first embodiment, the contact holes 40a and 40b are formed so as to extend from the $SiO_2$ layer 39 as the uppermost layer to the upper surfaces of the NiSi layer 28aa and the TiN layer 18a. However, overetching for the contact holes 40a and 40b may be obviously carried out such that the contact holes 40a and 40b extend from the $SiO_2$ layer 39 into the NiSi layer 28aa and the TiN layer 18a. The same applies to other embodiments according to the present invention.

In the first embodiment, two SGTs are formed in each of the Si pillars 6a, 6b, and 6c. However, the present invention is also applicable to formation of a circuit in which one or three or more SGTs are formed. Similarly, this is also applicable to other embodiments according to the present invention.

In the first embodiment, silicide is formed in the P-type poly-Si layers 22a and 22b and $N^+$-type poly-Si layers 26a and 26b due to Ni atoms in the Ni layers 21a and 21b, to thereby make the NiSi layers 28a and 28b protrude into the spaces 25a, 25b, and 25c. Instead of the Ni layers 21a and 21b, layers of another metal such as titanium (Ti) or cobalt (Co) may be employed to achieve protrusion of silicide layers into the spaces 25a, 25b, and 25c. Alternatively, silicide layers having a high content of metal atoms may be formed by, for example, sputtering deposition, and subsequently the silicide layers may be made to protrude into the spaces 25a, 25b, and 25c. Alternatively, another method may be employed to form connections between the $N^+$ layers 31b, 31c, 32b, and 32c and the $P^+$ layers 31a and 32a, and the NiSi layers 28aa, 28bb, 36a, and 36b, which are wiring conductor layers horizontally disposed and connect to the gate TiN layers 18c, 18d, and 18e surrounding the outer peripheries of the Si pillars 6a, 6b, and 6c. Similarly, this is also applicable to other embodiments according to the present invention.

In the first embodiment, the $SiO_2$ layers 41a and 41c are formed on the side surfaces (facing the side surfaces of the contact holes 40a and 40b) of the NiSi layers 36a and 28bb, which are upper wiring conductor layers. Alternatively, overetching may be carried out by RIE etching to thereby remove the $SiO_2$ layers 41a and 41c from the side surfaces of the NiSi layers 36a and 28bb. Similarly, this is also applicable to other embodiments according to the present invention.

The first embodiment describes a configuration in which the Si pillars 6a, 6b, and 6c are formed on the $SiO_2$ layer substrate 1 to form the SRAM cell circuit. Alternatively, instead of the $SiO_2$ layer substrate 1, another substrate such as an SOI (Silicon on Insulator) substrate or a Si substrate may be employed. In the case of employing a Si substrate, well structures may be formed in the surface layer of the Si substrate, the well structures corresponding to the $N^+$ layer or $P^+$ layer functioning as the source or drain in the bottom portions of the Si pillars 6a, 6b, and 6c. Similarly, this is also applicable to other embodiments according to the present invention.

In the first embodiment, the W layers 43aa, 43bb, 54aa, and 54bb may be other conductor layers or may be constituted by plural conductor layers including a barrier layer, for example. Other material layers may be used in combination as long as properties intended in this embodiment are provided. The same applies to other embodiments according to the present invention.

In the first embodiment, formation of connections between the side surfaces of the Si pillars 6a, 6b, and 6c and the NiSi layers 28aa and 28bb, formation of the NiSi layers 30a, 30b, 30c, 32a, 32b, and 32c within the Si pillars 6a, 6b, and 6c, and formation of the $P^+$ layers 31a and 33a and the $N^+$ layers 31b, 31c, 33b, and 33c are carried out by a heat treatment in FIGS. 2KA to 2KD. These formation of connections between the side surfaces of the Si pillars 6a, 6b, and 6c and the NiSi layers 28aa and 28bb, formation of the NiSi layers 30a, 30b, 30c, 32a, 32b, and 32c within the Si pillars 6a, 6b, and 6c, and formation of the $P^+$ layers 31a and 33a and $N^+$ layers 31b, 31c, 33b, and 33c, are achieved at any appropriate timing by the final step for the production of the SGTs. The same applies to other embodiments according to the present invention.

The first embodiment describes a configuration employing the SiN layers 15 and 35, which are layers formed of a single material. Alternatively, composite material layers may be employed, for example, a composite material layer including a lower portion that is a $SiO_2$ layer and an upper portion that is a SiN layer. Alternatively, instead of the SiN layers 15 and 35, insulating material layers having a low diffusion coefficient of HF ions may be employed. This is also applicable to other embodiments according to the present invention.

The above embodiments describe examples in which semiconductor regions such as channels, sources, and drains in the semiconductor pillars are formed of Si (silicon). However, this does not limit the present invention. The technical idea of the present invention is also applicable to SGT-including semiconductor devices that employ Si-containing semiconductor materials such as SiGe, or semiconductor materials other than Si.

The first embodiment relates to a configuration in which the gate conductive layers are the TiN layers 18a, 18b, 18c, and 18d. However, the gate conductive layers are not limited to this example and may be formed of another metal material. Alternatively, the gate conductive layers may have a multilayer structure including a metal layer and, for example, a poly-Si layer. Similarly, this is also applicable to other embodiments according to the present invention.

In the third embodiment, in all the contact holes 59a, 59b, 59c, 59d, 59e, 59f, and 59g, as with the W layers 43aa, 43bb, 54aa, and 54bb, the W layers 61a, 61b, 61c, 61d, 61e, 61f, and 61g are formed. These layers may not be necessary formed for all the contact holes and may be formed in regions that contribute to an increase in the density of the circuits.

In the first embodiment, for example, in an SGT including the N$^+$ layers 8bb and 31b serving as the source and the drain, these layers are formed of impurity regions containing the same donor impurity. Alternatively, this SGT may be formed as a tunnel effect SGT including impurity regions of different conductivity types. The same applies to the other SGTs. Similarly, this is also applicable to other embodiments according to the present invention.

The present invention encompasses various embodiments and various modifications without departing from the broad spirit and scope of the present invention. The above-described embodiments are provided for understanding of examples of the present invention and do not limit the scope of the present invention. Features of the above-described examples and modifications can be appropriately combined. The above-described embodiments from which some optional features have been eliminated depending on the need still fall within the spirit and scope of the present invention.

Methods for producing SGT-including pillar-shaped semiconductor devices according to embodiments of the present invention provide highly integrated semiconductor devices.

What is claimed is:

1. A method for producing a pillar-shaped semiconductor device, the method comprising:
   a step of providing a stack structure including a semiconductor structure including at least one semiconductor pillar formed on a substrate so as to be perpendicular to a surface of the substrate, a gate insulating layer formed so as to surround an outer periphery of the at least one semiconductor pillar, a gate conductor layer formed so as to surround the gate insulating layer, a first impurity region connected to the at least one semiconductor pillar, and a second impurity region connected to the at least one semiconductor pillar so as to be separated from the first impurity region, and
   a first wiring conductor layer, a second wiring conductor layer, and a third wiring conductor layer that individually connect to any one of the gate conductor layer, the first impurity region, and the second impurity region of the semiconductor structure, that extend in a horizontal direction along the surface of the substrate, that at least partially overlap in plan view, and that are present in this order from a lower level to a higher level;
   a step of forming a first contact region that extends through the third wiring conductor layer and the second wiring conductor layer to an upper surface or inside of the first wiring conductor layer;
   a step of forming a first tubular insulating layer in a portion that is on a side surface of the first contact region and is on a side surface of the second wiring conductor layer;
   a step of filling the first contact region to form a first conductor layer;
   a step of exposing a top portion of the first conductor layer and subsequently forming a first material layer so as to surround the top portion of the first conductor layer;
   a step of forming a first insulating layer over an entirety of the stack structure, and subsequently planarizing upper surfaces of the first conductor layer, the first material layer, and the first insulating layer so as to expose upper surfaces of the first conductor layer and the first material layer;
   a step of removing the first material layer;
   a step of forming a second contact region, through the first insulating layer serving as a mask, so as to extend to an upper surface of the third wiring conductor layer; and
   a step of filling the second contact region to form a second conductor layer.

2. The method for producing a pillar-shaped semiconductor device according to claim 1, further comprising a step of adjusting the first conductor layer and the second conductor layer such that a level of a surface of a top portion of the first conductor layer matches with a level of a surface of a top portion of the second conductor layer.

3. The method for producing a pillar-shaped semiconductor device according to claim 1, wherein the step of forming the second conductor layer includes filling a conductor material into the second contact region and depositing the conductor material on the first insulating layer, and subsequently subjecting the conductor material to a lithographic process and etching to form a single layer that includes the second conductor layer and a wiring conductor layer connecting to upper surfaces of the first conductor layer and the second conductor layer.

4. The method for producing a pillar-shaped semiconductor device according to claim 1, further comprising:
   a step of forming at least one third contact region that is formed, in plan view, in a position other than in the first contact region, that extends downward beyond a surface of the first insulating layer, and that connects to any one of the gate conductor layer, the first impurity region, and the second impurity region;
   a step of filling the at least one third contact region to form a third conductor layer formed of a conductor material that is the same as in the first conductor layer; and
   a step of adjusting the first conductor layer and the third conductor layer such that a level of a surface of a top portion of the first conductor layer matches with a level of a surface of a top portion of the third conductor layer.

5. The method for producing a pillar-shaped semiconductor device according to claim 1, wherein the first wiring conductor layer, the second wiring conductor layer, and the third wiring conductor layer are each formed of metal or alloy or a semiconductor material layer containing acceptor or donor impurity.

6. The method for producing a pillar-shaped semiconductor device according to claim 1, wherein at least any one of the first wiring conductor layer, the second wiring conductor layer, and the third wiring conductor layer has a single-crystal semiconductor layer that connects to the side surface of the at least one semiconductor pillar and that contains acceptor or donor impurity.

7. The method for producing a pillar-shaped semiconductor device according to claim 1, wherein, in plan view, a portion of an outer periphery of the first contact hole region overlaps at least any one of the first wiring conductor layer, the second wiring conductor layer, and the third wiring conductor layer.

* * * * *